US012812937B2

(12) United States Patent
Eikyu et al.

(10) Patent No.: US 12,812,937 B2
(45) Date of Patent: Nov. 24, 2026

(54) SEMICONDUCTOR DEVICE AND METHOD OF MANUFACTURING THE SAME

(71) Applicant: Renesas Electronics Corporation, Tokyo (JP)

(72) Inventors: Katsumi Eikyu, Tokyo (JP); Ryota Kuroda, Tokyo (JP); Hitoshi Matsuura, Tokyo (JP); Sho Nakanishi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 364 days.

(21) Appl. No.: 18/523,734

(22) Filed: Nov. 29, 2023

(65) Prior Publication Data

US 2024/0178277 A1 May 30, 2024

(30) Foreign Application Priority Data

Nov. 30, 2022 (JP) ................................ 2022-190871

(51) Int. Cl.

*H10D 62/13* (2025.01)
*H10D 12/00* (2025.01)
*H10D 12/01* (2025.01)
*H10D 62/10* (2025.01)
*H10D 64/23* (2025.01)

(Continued)

(52) U.S. Cl.

CPC ......... *H10D 62/133* (2025.01); *H10D 12/038* (2025.01); *H10D 12/481* (2025.01); *H10D 62/127* (2025.01); *H10D 64/231* (2025.01); *H10P 30/204* (2026.01); *H10P 30/21* (2026.01); *H10P 30/22* (2026.01)

(58) Field of Classification Search

CPC .. H10D 62/133; H10D 64/231; H10D 62/145; H10D 12/038; H10D 12/481; H10D 62/106; H10D 62/177; H10D 62/393

See application file for complete search history.

(56) References Cited

U.S. PATENT DOCUMENTS 9,023,692 B2 5/2015 Yoshida et al.
9,041,050 B2 5/2015 Matsuura (Continued)

FOREIGN PATENT DOCUMENTS

JP 2007-258617 A 10/2007
JP 2013-140885 A 7/2013

(Continued)

OTHER PUBLICATIONS

Motomi (JP 2007258617 A) [English Translation PDF] (Year: 2007).*

Office Action dated Feb. 3, 2026, issued in corresponding Japanese patent application No. 2022-190871.

*Primary Examiner* — Bac H Au

(74) *Attorney, Agent, or Firm* — Rimon P.C.

(57) ABSTRACT

A semiconductor substrate includes a plurality of emitter formation regions separated from each other in a Y direction between a pair of trenches, and a separation region located between the emitter formation regions. A p-type base region is formed in the semiconductor substrate of each of the emitter formation regions and the separation region. An n-type impurity region is formed in the base region of each emitter formation region. The impurity region is also formed in the base region at a position in contact with the pair of trenches in the separation region.

6 Claims, 39 Drawing Sheets

A-A CROSS SECTION

(51) Int. Cl.
*H10P 30/20* (2026.01)
*H10P 30/22* (2026.01)

(56) References Cited

U.S. PATENT DOCUMENTS

| | | | | |
|---|---|---|---|---|
| 9,780,203 | B2 | 10/2017 | Nagata | |
| 9,818,851 | B2 * | 11/2017 | Nagata | H10D 12/481 |
| 9,818,853 | B2 * | 11/2017 | Matsuura | H10D 12/481 |
| 9,842,919 | B2 * | 12/2017 | Matsuura | H10D 12/01 |
| 9,941,396 | B2 * | 4/2018 | Matsuura | H10D 62/106 |
| 10,186,609 | B2 * | 1/2019 | Yamada | H10D 12/481 |
| 10,505,029 | B2 * | 12/2019 | Nagata | H10D 64/519 |
| 10,672,897 | B2 * | 6/2020 | Nagata | H10D 64/117 |
| 12,414,346 | B2 * | 9/2025 | Maruyama | H10D 12/481 |
| 2012/0292662 | A1 * | 11/2012 | Matsuura | H10D 12/481<br>257/E29.198 |
| 2013/0175574 | A1 * | 7/2013 | Matsuura | H10D 12/481<br>438/138 |
| 2015/0255572 | A1 * | 9/2015 | Matsuura | H10D 12/038<br>438/270 |
| 2023/0197827 | A1 * | 6/2023 | Lin | H10D 12/038<br>257/143 |

FOREIGN PATENT DOCUMENTS

| | | | |
|---|---|---|---|
| JP | 2014-075582 | A | 4/2014 |
| JP | 2017-017209 | A | 1/2017 |

* cited by examiner

A–A CROSS SECTION

B–B CROSS SECTION

A–A CROSS SECTION

A–A CROSS SECTION

A–A CROSS SECTION

A-A CROSS SECTION

A-A CROSS SECTION

A–A CROSS SECTION

A-A CROSS SECTION

B–B CROSS SECTION

A-A CROSS SECTION

A-A CROSS SECTION

A-A CROSS SECTION

A–A CROSS SECTION

A–A CROSS SECTION

B-B CROSS SECTION

A–A CROSS SECTION

A-A CROSS SECTION

A-A CROSS SECTION

A–A CROSS SECTION

A–A CROSS SECTION

B-B CROSS SECTION

A–A CROSS SECTION

B–B CROSS SECTION

A-A CROSS SECTION, B-B CROSS SECTION

A–A CROSS SECTION

B-B CROSS SECTION

<STUDY EXAMPLE>

SEMICONDUCTOR DEVICE AND METHOD OF MANUFACTURING THE SAME

CROSS-REFERENCE TO RELATED APPLICATIONS

The disclosure of Japanese Patent Application No. 2022-190871 filed on Nov. 30, 2022 including the specification, drawings and abstract is incorporated herein by reference in its entirety.

BACKGROUND

The present invention relates to a semiconductor device and a method of manufacturing the same, and more particularly, to a semiconductor device including a gate electrode formed inside a trench and a method of manufacturing the same.

In recent years, a semiconductor device including a power semiconductor element such as an insulated gate bipolar transistor (IGBT) has been widely used. As an IGBT having low on-resistance, an IGBT employing a structure in which a gate electrode is embedded in a trench is known.

There is disclosed a technique listed below.

[Patent Document 1] Japanese Unexamined Patent Application Publication No. 2013-140885

For example, Patent Document 1 discloses an IGBT having a GGEE structure using an injection enhancement (IE) effect. The IE effect is a technique of increasing the concentration of charges accumulated in the drift region by making it difficult for holes to be discharged to the emitter electrode EE side when the IGBT is in the ON state.

The "G" of the GGEE structure means a structure in which a gate electrode connected to a gate potential is embedded inside a trench, and is called a gate trench. The "E" of the GGEE structure means a structure in which a gate electrode connected to an emitter potential is embedded inside a trench, and is called an emitter trench. Therefore, the GGEE structure is a structure in which a pair of emitter trenches is formed at positions away from a pair of gate trenches to some extent.

Patent Document 1 discloses an IGBT having the GGEE structure employing the IE effect. In this IGBT, an n-type emitter region formed between a pair of gate trenches is divided into a plurality of parts along an extending direction of the trench.

SUMMARY

FIG. 39 is a plan view illustrating a semiconductor device of a study example studied by the inventors of the present application, and illustrates an IGBT having a GGEE structure. The trench TR formed in the active cell AC and the gate electrode GE1 formed inside the trench TR constitute a gate trench. In addition, the trench TR formed in the inactive cell IAC and the gate electrode GE2 formed inside the trench TR constitute an emitter trench. In the plurality of emitter formation regions ER, an n-type impurity region NE is formed. The impurity region NE is not formed in the separation region SR between the plurality of emitter formation regions ER.

For example, in a product requiring a high voltage resistance such as 750 V to 2300 V, since the power supply voltage becomes high, it is necessary to increase the load short-circuit tolerance. For this purpose, it is effective to reduce the channel density by using a method such as reducing the width of the emitter formation region ER and increasing the width of the separation region SR in the Y direction. Since this method can be performed only by the layout change of the mask, there is also an advantage that an increase in manufacturing cost can be suppressed.

However, when the inventors of the present application conducted verification on a high withstand voltage product, a voltage tail was observed in the waveform of the forward voltage Vce at the time of turn-on, and a significant increase in switching loss was sometimes observed. In order to identify the cause, the present inventors performed analysis using TCAD and the like. As a result, it has been found that, in the process of switching, the inversion layer spreads in the p-type base region PB of the separation region SR by the voltage of the gate electrode GE1. Then, it has been found that sufficient electrons are not supplied to the vicinity of the center of the separation region SR due to the influence of the resistance of the inversion layer. The inventors of the present application have found that this deficiency of electrons is one of the causes of the voltage tail.

A main object of the present application is to improve the performance of the semiconductor device by suppressing the influence of the resistance of the inversion layer and reducing the switching loss. Other problems and novel features will become apparent from the description of the present specification and the accompanying drawings.

An outline of representative embodiments disclosed in the present application will be briefly described as follows.

A semiconductor device according to an embodiment includes: a semiconductor substrate of a first conductivity type having an upper surface and a lower surface; a pair of first trenches formed in the semiconductor substrate on an upper surface side of the semiconductor substrate and extending in a first direction in plan view; a pair of first gate insulating films formed inside the pair of first trenches; a pair of first gate electrodes embedded in the pair of first trenches via the pair of first gate insulating films; a base region of a second conductivity type opposite to the first conductivity type, the base region being formed in the semiconductor substrate on an upper surface side of the semiconductor substrate; and a first impurity region of the first conductivity type and a second impurity region of the first conductivity type formed in the semiconductor substrate on an upper surface side of the semiconductor substrate. The semiconductor substrate has, between the pair of first trenches, a first emitter formation region and a second emitter formation region that are separated from each other in the first direction, and a separation region located between the first emitter formation region and the second emitter formation region, the base region is formed in the semiconductor substrate of each of the first emitter formation region, the second emitter formation region, and the separation region, the first impurity region is formed in the base region of each of the first emitter formation region and the second emitter formation region, the second impurity region is formed in the base region at a first location in the separation region, the first location being in contact with the pair of first trenches, and the second impurity region is connected to the first impurity region of each of the first emitter formation region and the second emitter formation region.

A semiconductor device according to an embodiment includes: a semiconductor substrate of a first conductivity type having an upper surface and a lower surface; a pair of first trenches formed in the semiconductor substrate on an upper surface side of the semiconductor substrate and extending in a first direction in plan view; a pair of first gate insulating films formed inside the pair of first trenches; a pair of first gate electrodes embedded in the pair of first trenches via the pair of first gate insulating films; a base region of a second conductivity type opposite to the first conductivity type, the base region being formed in the semiconductor substrate on an upper surface side of the semiconductor substrate; and a first impurity region of the first conductivity type and a second impurity region of the first conductivity type formed in the semiconductor substrate on an upper surface side of the semiconductor substrate. The semiconductor substrate has, between the pair of first trenches, a first emitter formation region and a second emitter formation region that are separated from each other in the first direction, and a separation region located between the first emitter formation region and the second emitter formation region, the base region is formed in the semiconductor substrate of each of the first emitter formation region, the second emitter formation region, and the separation region, the first impurity region is formed in the base region of each of the first emitter formation region and the second emitter formation region, and an impurity concentration of the base region at a first location in contact with the pair of first trenches in the separation region is lower than an impurity concentration of the base region of each of the first emitter formation region and the second emitter formation region.

A method of manufacturing a semiconductor device according to an embodiment includes: (a) preparing a semiconductor substrate of a first conductivity type having an upper surface and a lower surface; (b) forming a pair of first trenches in the semiconductor substrate on an upper surface side of the semiconductor substrate so as to extend in a first direction in plan view; (c) forming a pair of first gate insulating films inside the pair of first trenches; (d) embedding a pair of first gate electrodes inside the pair of first trenches via the pair of first gate insulating films; (e) forming a base region of a second conductivity type opposite to the first conductivity type in the semiconductor substrate on an upper surface side of the semiconductor substrate; and (f) forming a first impurity region of the first conductivity type and a second impurity region of the first conductivity type in the semiconductor substrate on an upper surface side of the semiconductor substrate. The semiconductor substrate has, between the pair of first trenches, a first emitter formation region and a second emitter formation region that are separated from each other in the first direction, and a separation region located between the first emitter formation region and the second emitter formation region, the base region is formed in the semiconductor substrate of each of the first emitter formation region, the second emitter formation region, and the separation region, the first impurity region is formed in the base region of each of the first emitter formation region and the second emitter formation region, the second impurity region is formed in the base region at a first location in the separation region, the first location being in contact with the pair of first trenches, and the second impurity region is connected to the first impurity region of each of the first emitter formation region and the second emitter formation region.

According to an embodiment, the performance of the semiconductor device can be improved.

DETAILED DESCRIPTION

Figure 1:
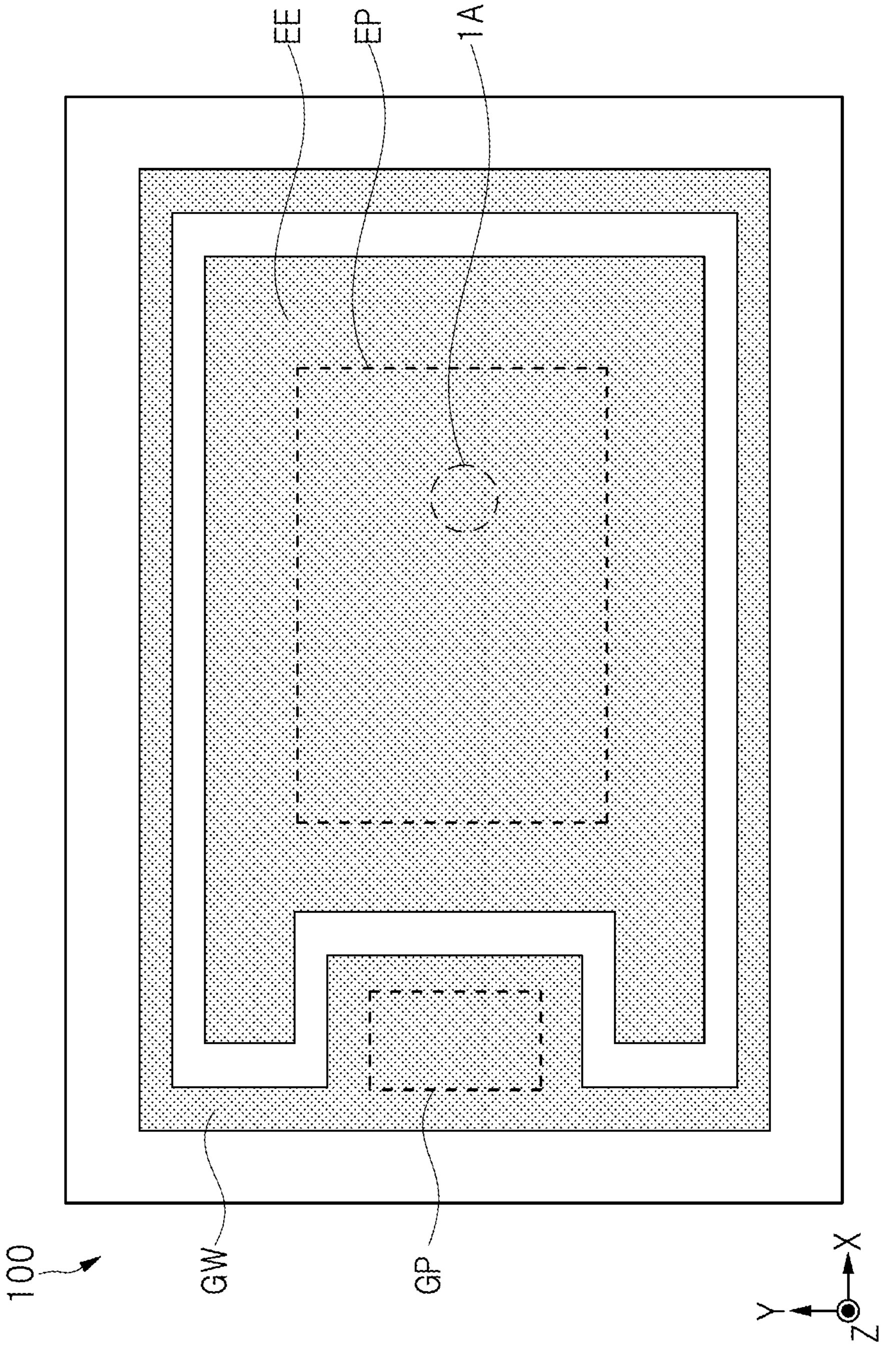
FIG. 1 is a plan view illustrating a semiconductor device according to a first embodiment.

Hereinafter, embodiments will be described in detail with reference to the drawings. In all the drawings for describing the embodiments, members having the same functions are denoted by the same reference numerals, and repeated description thereof will be omitted. In addition, in the following embodiments, descriptions of the same or similar parts will not be repeated in principle unless particularly necessary.

An X direction, a Y direction, and a Z direction described in the present application intersect each other and are orthogonal to each other. In the present application, the Z direction will be described as a vertical direction, a height direction, or a thickness direction of a certain structure. In addition, the expression such as "plan view" or "in plan view" used in the present application means that a surface constituted by the X direction and the Y direction is a "plane" and this "plane" is viewed from the Z direction.

First Embodiment

<Structure of Semiconductor Device>

A structure of a semiconductor device 100 according to the first embodiment will be described below with reference to FIGS. 1 to 4.

FIG. 1 is a plan view illustrating a semiconductor chip which is the semiconductor device 100. As illustrated in FIG. 1, most of the semiconductor device 100 is covered with an emitter electrode EE. A gate wiring GW is formed so as to surround the emitter electrode EE in plan view.

Although not illustrated here, the emitter electrode EE and the gate wiring GW are covered with a protective film such as a polyimide film. On the emitter electrode EE and the gate wiring GW, an opening is provided in a part of the protective film, and a region exposed in the opening is an emitter pad EP and a gate pad GP. By connecting an external connection member such as a bonding wire or a clip on the emitter pad EP and the gate pad GP, the semiconductor device 100 is electrically connected to another semiconductor chip, a wiring board, or the like.

Figure 2:
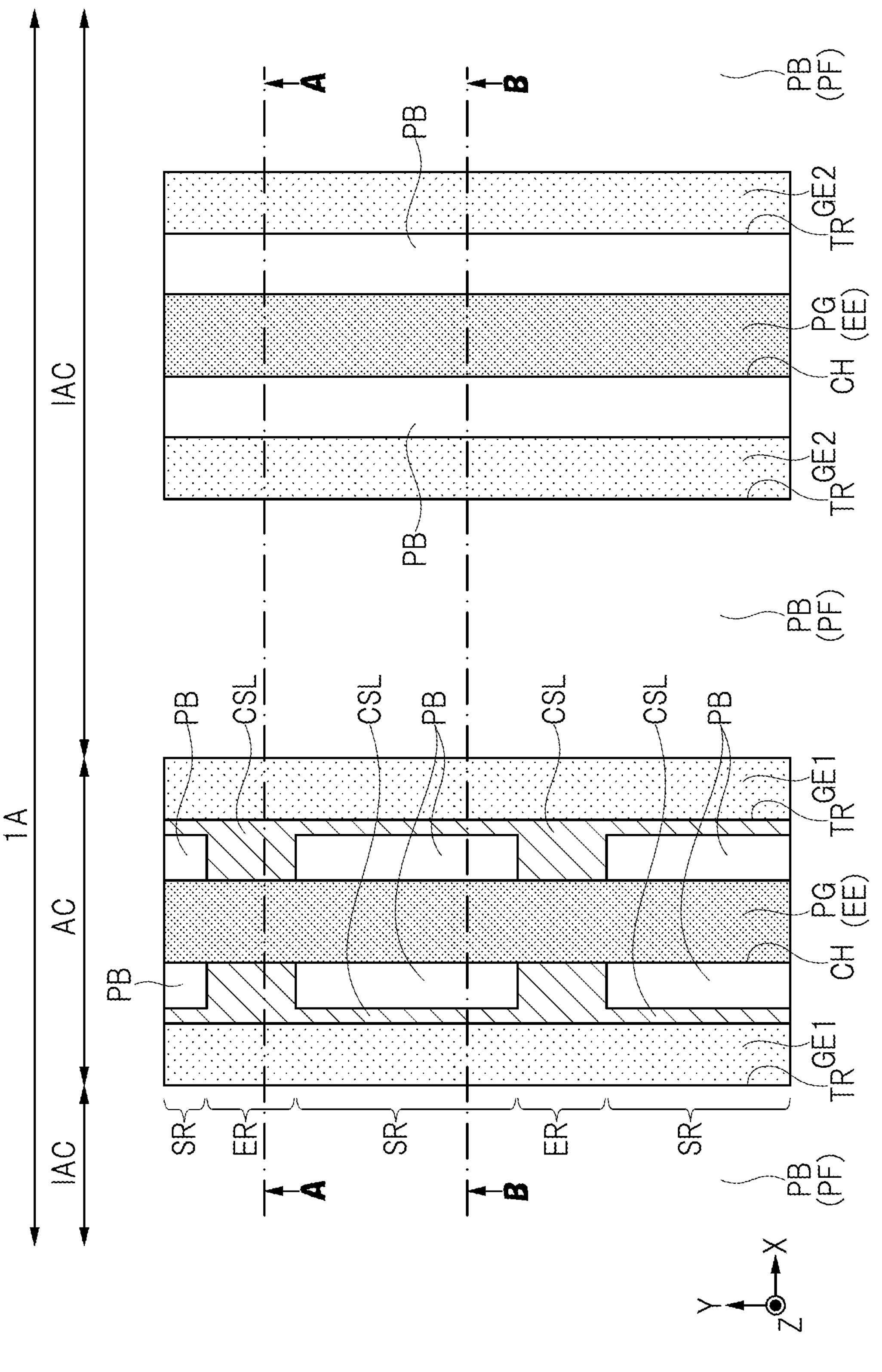
FIG. 2 is a plan view of a main part illustrating the semiconductor device according to the first embodiment.

FIG. 2 is a plan view of a main part corresponding to a region 1A illustrated in FIG. 1. The region 1A is a cell region in which a power semiconductor element such as an IGBT is formed. The IGBT illustrated in FIG. 2 is an IGBT having a GGEE structure employing the IE effect. The semiconductor device 100 includes an active cell AC for performing the main operation of the IGBT and an inactive cell IAC other than the active cell AC.

As illustrated in FIG. 2, the plurality of trenches TR extend in the Y direction and are adjacent to each other in the X direction. A gate electrode GE1 is formed inside the trench TR of the active cell AC. A gate electrode GE2 is formed inside the trench TR of the inactive cell IAC.

A gate wiring GW is electrically connected to the gate electrode GE1 of the active cell AC, and a gate potential is supplied during operation of the IGBT. An emitter electrode EE is electrically connected to the gate electrode GE2 of the inactive cell IAC, and an emitter potential is supplied during operation of the IGBT. In addition, the emitter electrode EE is electrically connected to the base region PB and the impurity region CSL of the active cell AC and the base region PB between the pair of gate electrodes GE2 via the plug PG, and the emitter potential is supplied during the operation of the IGBT.

In the inactive cell IAC, a floating region PF is provided between the gate electrode GE1 and the gate electrode GE2. The floating region PF and the base region PB formed in the floating region PF are in an electrically floating state.

In addition, the semiconductor substrate SUB includes a plurality of emitter formation regions ER separated from each other in the Y direction between the pair of trenches TR of the active cell AC, and a separation region SR located between the emitter formation regions ER. The n-type impurity region formed in the emitter formation region ER becomes an emitter region of the IGBT. In the first embodiment, an n-type impurity region CSL is formed in the emitter formation region ER.

The impurity region CSL is also formed at a portion in contact with the pair of trenches TR in the separation region SR. The impurity region CSL of the separation region SR is connected to the impurity region CSL of the emitter formation region ER. In the first embodiment, these impurity regions CSL have the same impurity concentration.

A main feature of the first embodiment is that an impurity region CSL is formed at a position in contact with the pair of trenches TR in the separation region SR. Such a feature and its effect will be described in detail later.

The width of the emitter formation region ER in the Y direction is, for example, 0.25 μm or more and 2.0 μm or less, and the width of the separation region SR in the Y direction is, for example, 0.25 μm or more and 50 μm or less. The ratio of the widths of these regions in the Y direction is preferably set as "separation region SR/emitter formation region ER=0.125 to 200".

Figure 3:
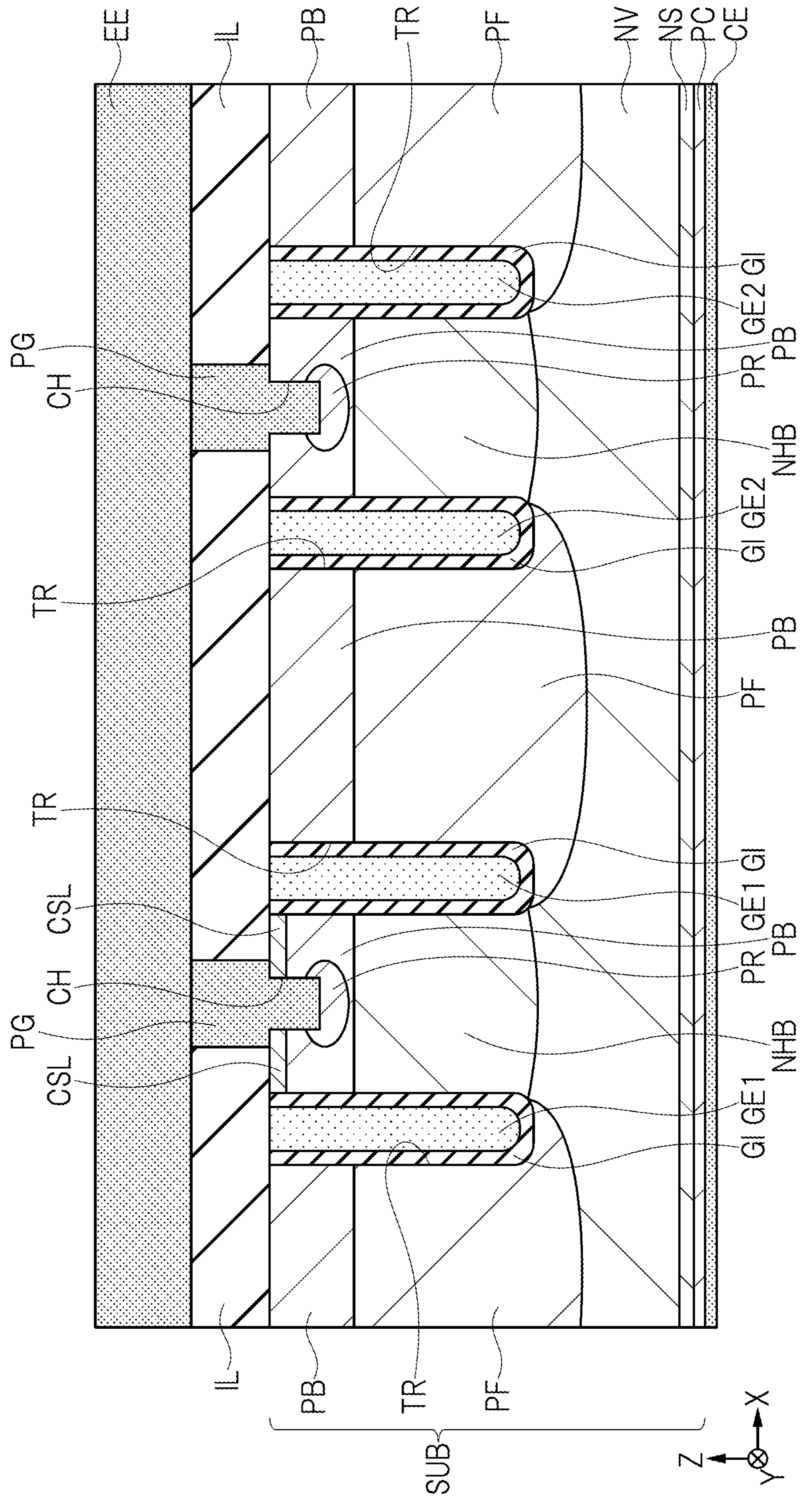
FIG. 3 is a cross-sectional view illustrating the semiconductor device according to the first embodiment.
Figure 4:
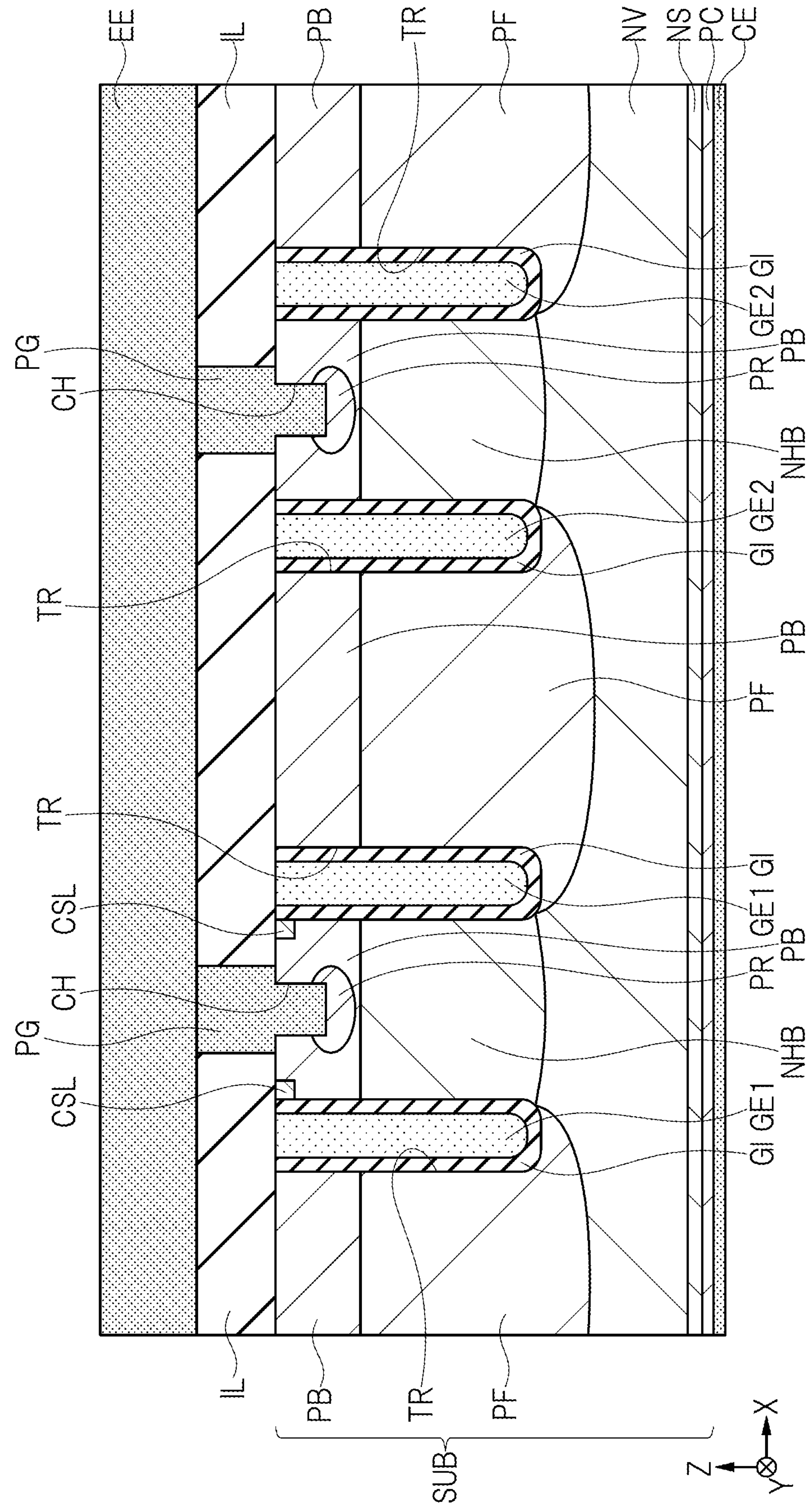
FIG. 4 is a cross-sectional view illustrating the semiconductor device according to the first embodiment.

FIG. 3 is a cross-sectional view taken along line A-A illustrated in FIG. 2, and illustrates a cross-sectional structure of the emitter formation region ER. FIG. 4 is a cross-sectional view taken along line B-B illustrated in FIG. 2, and illustrates a cross-sectional structure of the separation region SR.

As illustrated in FIGS. 3 and 4, the semiconductor device 100 includes an n-type semiconductor substrate SUB having an upper surface and a lower surface. The semiconductor substrate SUB is made of n-type silicon and has an n-type drift region NV. Here, the n-type semiconductor substrate SUB itself constitutes the drift region NV. Note that the semiconductor substrate SUB may be a stacked body of an n-type silicon substrate and an n-type silicon layer grown on the silicon substrate while introducing phosphorus (P) by an epitaxial growth method. In this case, the n-type silicon layer having an impurity concentration lower than that of the n-type silicon substrate constitutes the drift region NV.

On the lower surface side of the semiconductor substrate SUB, an n-type field stop region (impurity region) NS is formed in the semiconductor substrate SUB. The field stop region NS is provided to prevent a depletion layer extending from the pn junction on the upper surface side of the semiconductor substrate SUB from reaching the p-type collector region PC when the IGBT is turned off.

On the lower surface side of the semiconductor substrate SUB, a p-type collector region (impurity region) PC is formed in the semiconductor substrate SUB. The collector region PC is located below the field stop region NS.

The collector electrode CE is formed under the lower surface of the semiconductor substrate SUB. The collector electrode CE is electrically connected to the collector region PC and supplies a collector potential to the collector region PC. The collector electrode CE is, for example, a single-layer metal film such as an Au film, a Ni film, a Ti film, or an AlSi film, or a laminated metal film obtained by appropriately laminating these films.

On the upper surface side of the semiconductor substrate SUB, a plurality of trenches TR are formed in the semiconductor substrate SUB. The depth of the trench TR is, for example, 2 μm or more and 5 μm or less. A gate insulating film GI is formed inside the trench TR. The gate electrodes GE1 and GE2 are embedded inside the trench TR via the gate insulating film GI. The gate insulating film GI is an insulating film, for example, a silicon oxide film. The gate electrodes GE1 and GE2 are conductive films, and are, for example, polycrystalline silicon films into which n-type impurities are introduced. The thickness of the gate insulating film GI is, for example, 70 nm or more and 150 nm or less.

On the upper surface side of the semiconductor substrate SUB of the active cell AC, a hole barrier region (impurity region) NHB, a p-type base region (impurity region) PB, and an n-type impurity region CSL are formed in the semiconductor substrate SUB between the pair of trenches TR (the pair of gate electrodes GE1).

The base region PB is formed in the hole barrier region NHB of each of the emitter formation region ER and the separation region SR. The impurity region CSL is formed in the base region PB of the emitter formation region ER. The impurity region CSL is also formed in the base region PB at a position in contact with the pair of trenches TR in the separation region SR. The base region PB is formed to be shallower than the depth of each of the trench TR and the hole barrier region NHB. The impurity region NE is formed to be shallower than the depth of the base region PB.

On the upper surface side of the semiconductor substrate SUB of the inactive cell IAC, the hole barrier region NHB and the base region PB are formed in the semiconductor substrate SUB between the pair of trenches TR (the pair of gate electrodes GE2). The p-type base region PB is formed in the hole barrier region NHB.

In semiconductor substrate SUB between gate electrode GE1 and gate electrode GE2, the p-type floating region (impurity region) PF and the base region PB are formed. The p-type base region PB is formed in the floating region PF.

The floating region PF and the base region PB formed in the floating region PF are not electrically connected to the gate wiring GW and the emitter electrode EE, and are in an electrically floating state. In order to improve the junction breakdown voltage, the floating region PF is formed to a position deeper than the bottom of the trench TR and is formed so as to cover the bottom of the trench TR.

On the upper surface of the semiconductor substrate SUB, an interlayer insulating film IL is formed so as to cover the trench TR. The interlayer insulating film IL is, for example, a silicon oxide film. The thickness of the interlayer insulating film IL is, for example, 600 nm or more and 1500 nm or less.

In the active cell AC, the hole CH penetrates the interlayer insulating film IL and the impurity region CSL and reaches the inside of the base region PB. The hole CH is in contact with the base region PB in the emitter formation region ER and the separation region SR, and is in contact with the impurity region CSL in the emitter formation region ER. In the inactive cell IAC, the hole CH reaches the inside of the base region PB and is in contact with the base region PB.

In the upper portion of the hole CH, the interlayer insulating film IL recedes. That is, the size of the opening of hole CH located above the upper surface of the semiconductor substrate SUB is larger than the size of the opening of the hole CH located in the semiconductor substrate SUB. Therefore, a part of the upper surface of the impurity region CSL is exposed from the interlayer insulating film IL. Therefore, the emitter electrode EE contacts not only the side surface of the impurity region CSL but also a part of the upper surface of the impurity region CSL inside the hole CH. As a result, the contact resistance between the emitter electrode EE and the impurity region CSL can be reduced.

In the active cell AC and the inactive cell IAC, a p-type high-concentration diffusion region (impurity region) PR is formed in the base region PB around the bottom of the hole CH. The high-concentration diffusion region PR is provided to reduce contact resistance with the emitter electrode EE and to prevent latch-up.

A plug PG is embedded inside the hole CH. The plug PG includes a barrier metal film and a conductive film formed on the barrier metal film. The barrier metal film is, for example, a laminated film of a titanium film and a titanium nitride film formed on the titanium film. The conductive film is, for example, a tungsten film.

Although not illustrated herein, the hole CH is also formed on a part of each of the gate electrode GE1 and the gate electrode GE2, and the plug PG is also formed inside the hole CH.

The emitter electrode EE is formed on the interlayer insulating film IL. The emitter electrode EE is electrically connected to the impurity region CSL, the base region PB, the high-concentration diffusion region PR, and the gate electrode GE2 via the hole CH (plug PG), and supplies an emitter potential to these regions. Although not illustrated here, a gate wiring GW formed in the same manufacturing process as the emitter electrode EE is also formed on the interlayer insulating film IL. The gate wiring GW is electrically connected to the gate electrode GE1 through the hole CH (plug PG), and supplies a gate potential to the gate electrode GE1.

The emitter electrode EE and the gate wiring GW include a barrier metal film and a conductive film formed on the barrier metal film. The barrier metal film is, for example, a TiW film. The conductive film is, for example, an aluminum alloy film to which copper or silicon is added. The aluminum alloy film is a main conductor film of the emitter electrode EE and the gate wiring GW, and is sufficiently thicker than the TiW film.

As illustrated in FIG. 3, the impurity region CSL of the emitter formation region ER is in contact with the hole CH, but as illustrated in FIG. 4, the impurity region CSL of the separation region SR is physically separated from the hole CH. The emitter potential is indirectly supplied from the emitter electrode EE to the impurity region CSL of the separation region SR via the impurity region CSL and the hole CH of the emitter formation region ER.

The impurity concentration of each impurity region is exemplified below.

The impurity concentration of the drift region NV is, for example, $1\times10^{13}$ $cm^{-3}$ or more and $2\times10^{14}$ $cm^{-3}$ or less. The impurity concentration of the field stop region NS is higher than the impurity concentration of the drift region NV, and is, for example, $5\times10^{16}$ $cm^{-3}$ or more and $5\times10^{17}$ $cm^{-3}$ or less. The impurity concentration of the hole barrier region NHB is higher than the impurity concentration of the drift region NV, and is, for example, $2\times10^{16}$ $cm^{-3}$ or more and $1\times10^{17}$ $cm^{-3}$ or less.

The impurity concentration of the collector region PC is $1\times10^{17}$ $cm^{-3}$ or more and $1\times10^{21}$ $cm^{-3}$ or less. The floating region PF has an impurity concentration of $1\times10^{15}$ $cm^{-3}$ or more and $1\times10^{16}$ $cm^{-3}$ or less. The impurity concentration of the base region PB is higher than the impurity concentration of the floating region PF, and is $1\times10^{16}$ $cm^{-3}$ or more and $1\times10^{18}$ $cm^{-3}$ or less. The impurity concentration of the high-concentration diffusion region PR is higher than the impurity concentration of the base region PB, and is $1\times10^{18}$ $cm^{-3}$ or more and $1\times10^{21}$ $cm^{-3}$ or less.

In the first embodiment, the impurity concentration of the impurity region CSL is higher than the impurity concentration of the drift region NV and lower than the impurity concentration of the hole barrier region NHB, and is, for example, $1\times10^{15}$ $cm^{-3}$ or more and $1\times10^{16}$ $cm^{-3}$ or less. The impurity concentration of the impurity region CSL is set to such a concentration that an ohmic contact with the plug PG is established.

Main Features of First Embodiment

Figure 39:
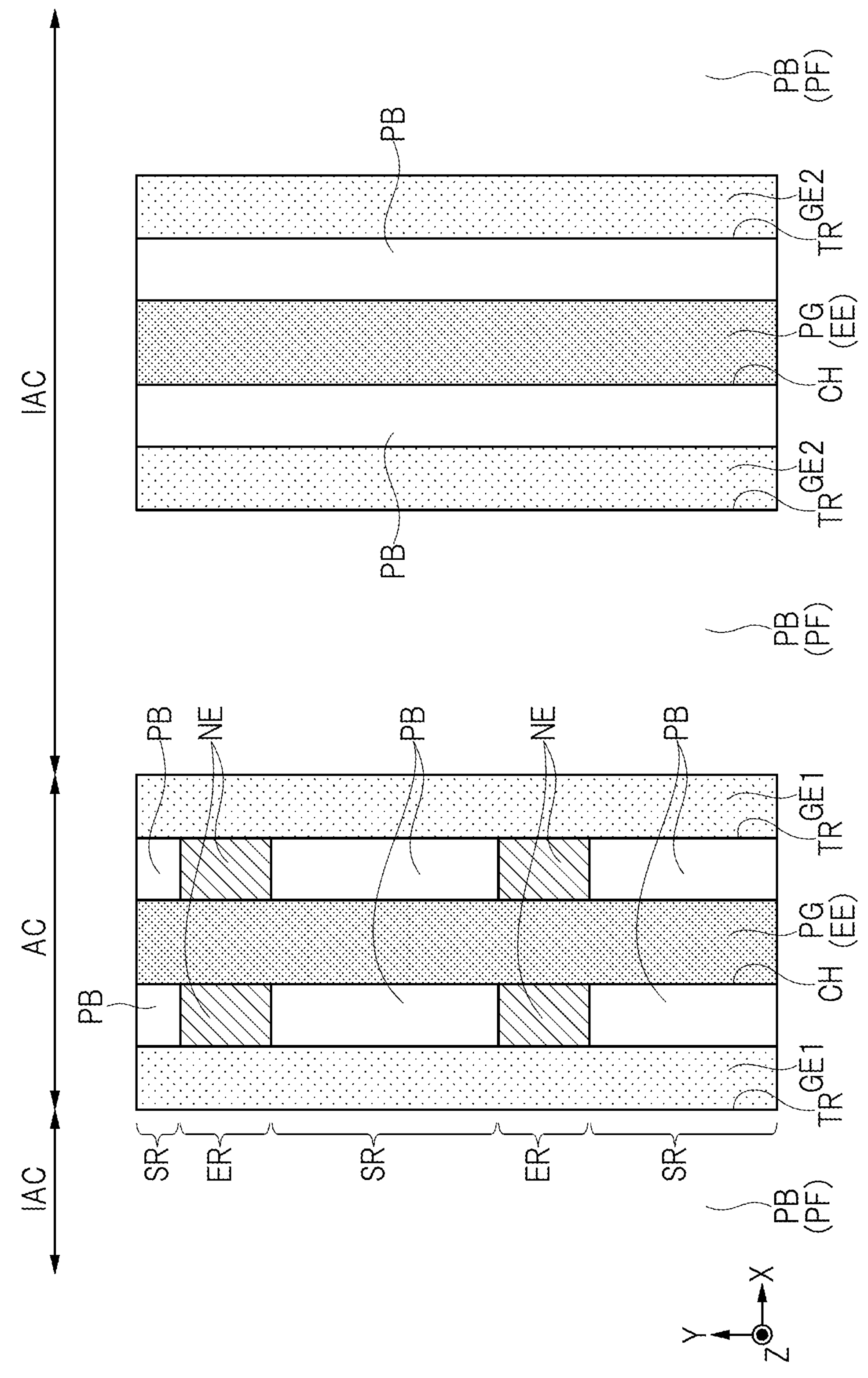
FIG. 39 is a plan view of a main part illustrating a semiconductor device in a study example.

As described in the above problem, in the study example of FIG. 39, the inversion layer spreads in the base region PB of the separation region SR by the voltage of the gate electrode GE1 in the process of switching. However, due to the influence of the resistance of the inversion layer, sufficient electrons are not supplied to the vicinity of the center of the separation region SR, and this shortage of electrons is a factor of an increase in switching loss.

In the first embodiment, the impurity region CSL is formed at a position in contact with the pair of trenches TR in the separation region SR. Therefore, a diffusion layer resistance corresponding to the width of the separation region SR exists between the emitter formation regions ER. As a result, electrons are easily supplied from the diffusion layer resistance to the vicinity of the center of the separation region SR, and the resistance of the inversion layer can be reduced. Therefore, the switching loss can be reduced, and the performance of the semiconductor device 100 can be improved.

Figure 5:
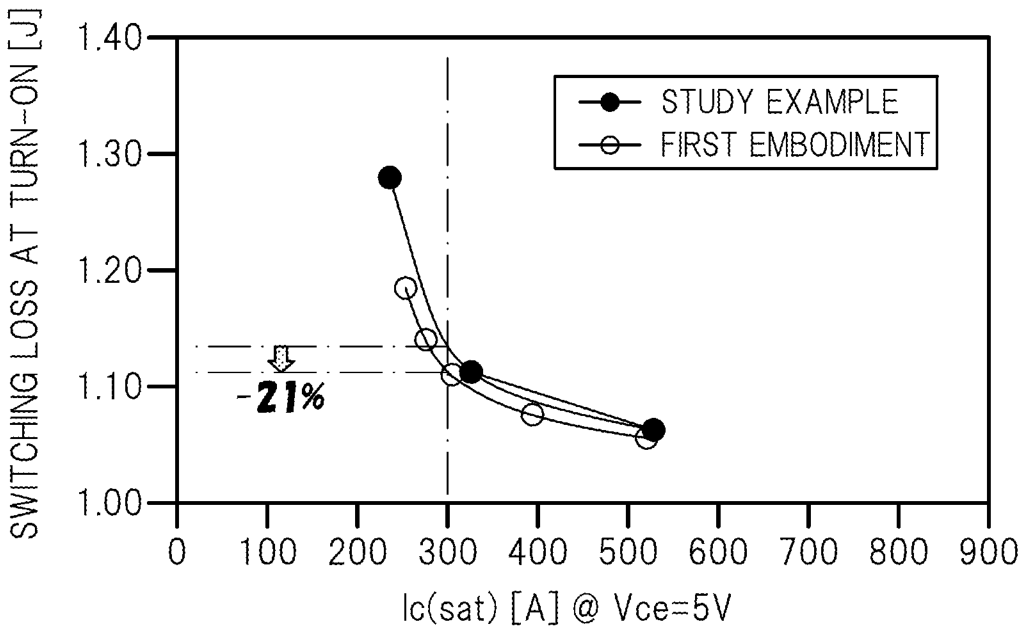
FIG. 5 is a graph showing a result of simulation by the inventors of the present application.
Figure 5:
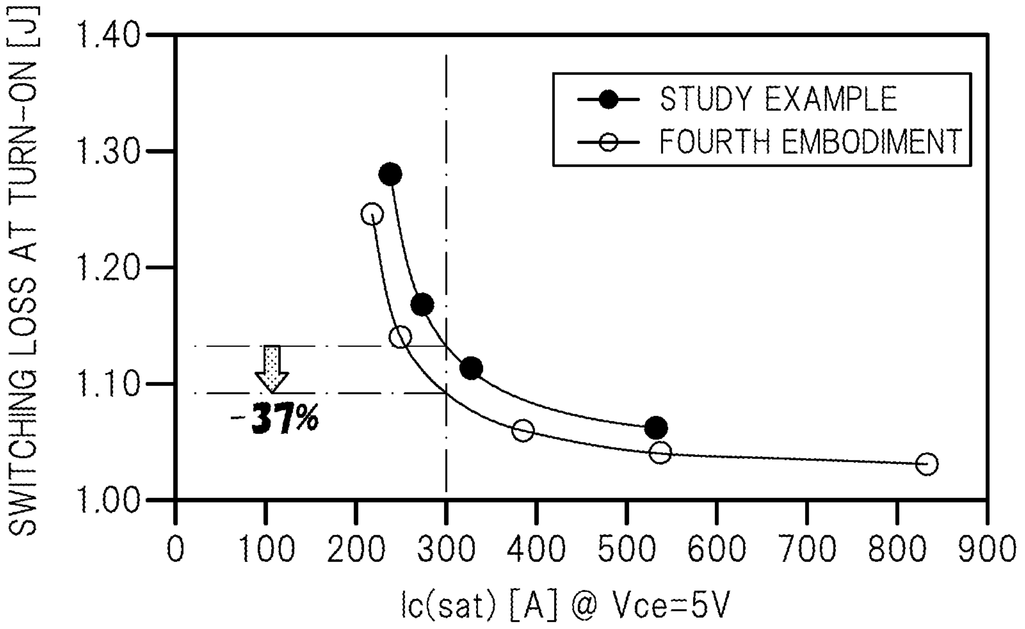

FIG. 5 is a graph showing a result of simulation by the inventors of the present application, and shows a comparison between the study example and the first embodiment. The horizontal axis represents the forward saturation current Ic (sat) in a case where the forward voltage Vce is 5 V, and the vertical axis represents the switching loss at the time of turn-on.

As illustrated in FIG. 5, in the first embodiment, the switching loss is reduced as compared with the study example. For example, when compared in a case where the forward saturation current Ic (sat) is 300 A, the switching loss is reduced by about 21% in the first embodiment as compared with the study example.

Further, the impurity region CSL is in ohmic contact with the plug PG, but the impurity region CSL of the separation region SR is separated from the hole CH. Therefore, the discharge of holes due to the parasitic PMOS operation in the separation region SR is not inhibited. By appropriately adjusting the width, the impurity concentration, and the like of the impurity region CSL of the separation region SR, the forward saturation current Ic (sat) can be appropriately adjusted.

<Method of Manufacturing Semiconductor Device>

Each manufacturing process included in the method of manufacturing a semiconductor device 100 according to the first embodiment will be described below with reference to FIGS. 6 to 17.

Figure 6:
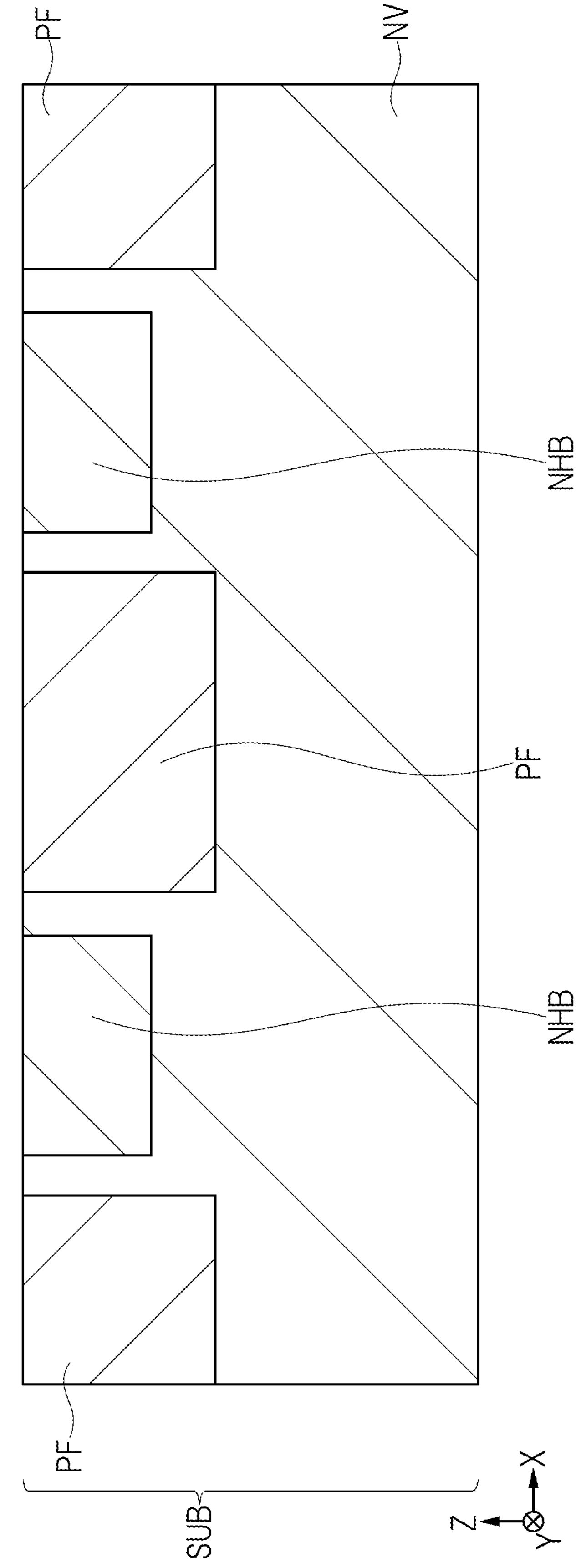
FIG. 6 is a cross-sectional view showing a manufacturing process of the semiconductor device according to the first embodiment.

As illustrated in FIG. 6, first, an n-type semiconductor substrate SUB having an upper surface and a lower surface is prepared. As described above, herein, the n-type semiconductor substrate SUB itself constitutes the drift region NV. The drift region NV may be a low-concentration n-type semiconductor layer grown on a high-concentration n-type silicon substrate while introducing phosphorus (P) by an epitaxial growth method. In the present application, a stacked body including such an n-type silicon substrate and an n-type semiconductor layer will also be described as a semiconductor substrate SUB.

Next, the floating region PF and the hole barrier region NHB are formed in the semiconductor substrate SUB by a photolithography technique and an ion implantation method. For ion implantation of the floating regions PF, for example, boron (B) is used as an impurity. For ion implantation of the hole barrier region NHB, for example, phosphorus (P) is used as an impurity. In the formation of each of the floating region PF and the hole barrier region NHB, ion implantation is performed a plurality of times with different energy and dose conditions. Next, in order to activate the impurities included in the floating regions PF and the hole barrier regions NHB, heat treatment is performed on the semiconductor substrate SUB. This heat treatment is performed, for example, in an atmosphere filled with an inert gas such as nitrogen gas under the condition of 900° C. or more and 1000° C. or less and 25 minutes or more and 40 minutes or less.

Figure 7:
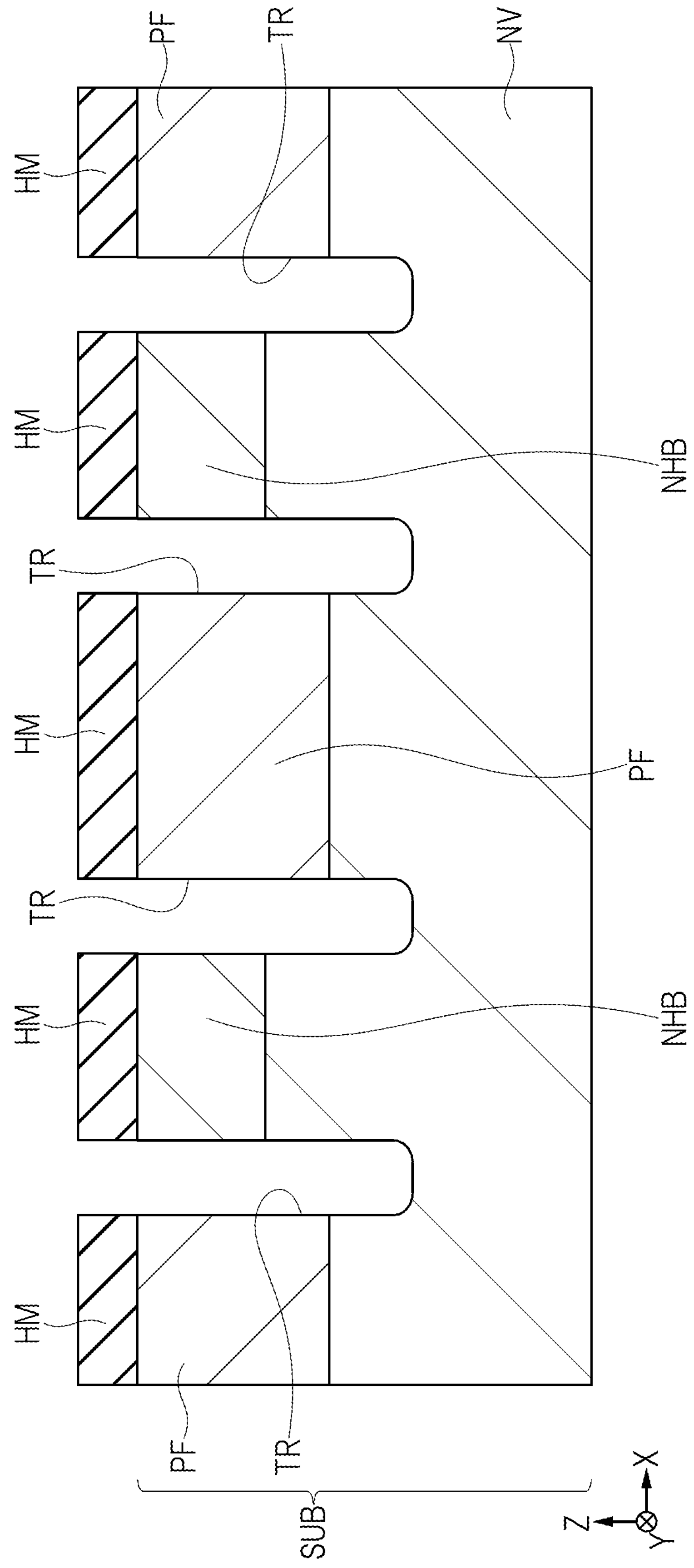
FIG. 7 is a cross-sectional view illustrating a manufacturing process subsequent to FIG. 6.

As illustrated in FIG. 7, the trench TR is formed in semiconductor substrate SUB on the upper surface side of the semiconductor substrate SUB. In order to form the trench TR, first, for example, a silicon oxide film is formed on the upper surface of the semiconductor substrate SUB by, for example, the CVD method. Next, a resist pattern having an opening is formed on the silicon oxide film. Next, the silicon oxide film is patterned by performing anisotropic etching processing using the resist pattern as a mask to form a hard mask HM. Next, the resist pattern is removed by an ashing process.

Next, the anisotropic etching processing is performed using the hard mask HM as a mask to form the trench TR in the semiconductor substrate SUB. Thereafter, the hard mask HM is removed by, for example, wet etching processing using a solution containing hydrofluoric acid.

Figure 8:
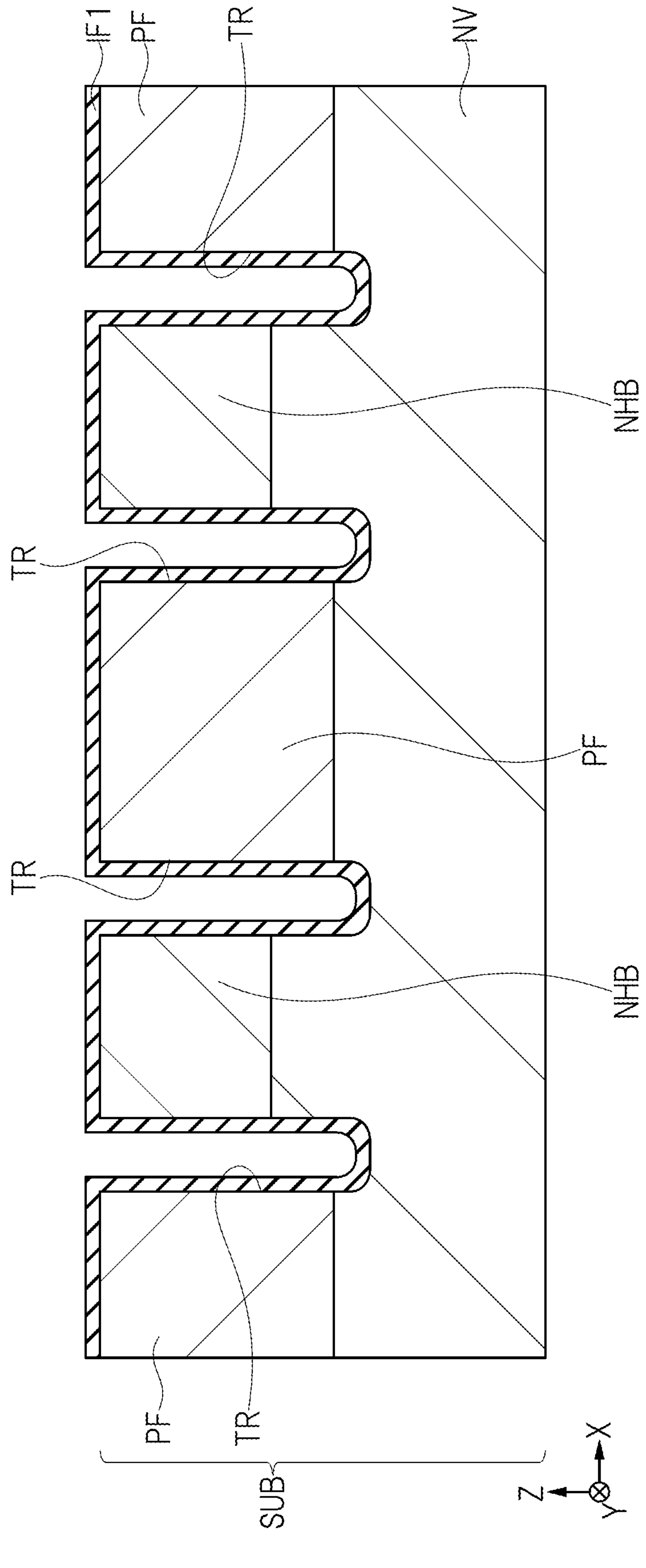
FIG. 8 is a cross-sectional view illustrating a manufacturing process subsequent to FIG. 7.

As illustrated in FIG. 8, a sacrificial oxide film IF1 is formed inside the trench TR and on the upper surface of the semiconductor substrate SUB. Accordingly, the damaged layer formed on the semiconductor substrate SUB is removed. Thereafter, the sacrificial oxide film IF1 is removed by, for example, wet etching processing using a solution containing hydrofluoric acid. The sacrificial oxide film IF1 is formed by performing thermal oxidation processing on the semiconductor substrate SUB. This thermal oxidation processing is performed, for example, in an atmosphere filled with an oxygen gas under the condition of 1000° C. or more and 1200° C. or less and 50 minutes or more and 70 minutes or less. As a result, impurities included in each of the floating region PF and the hole barrier region NHB are diffused.

Figure 9:
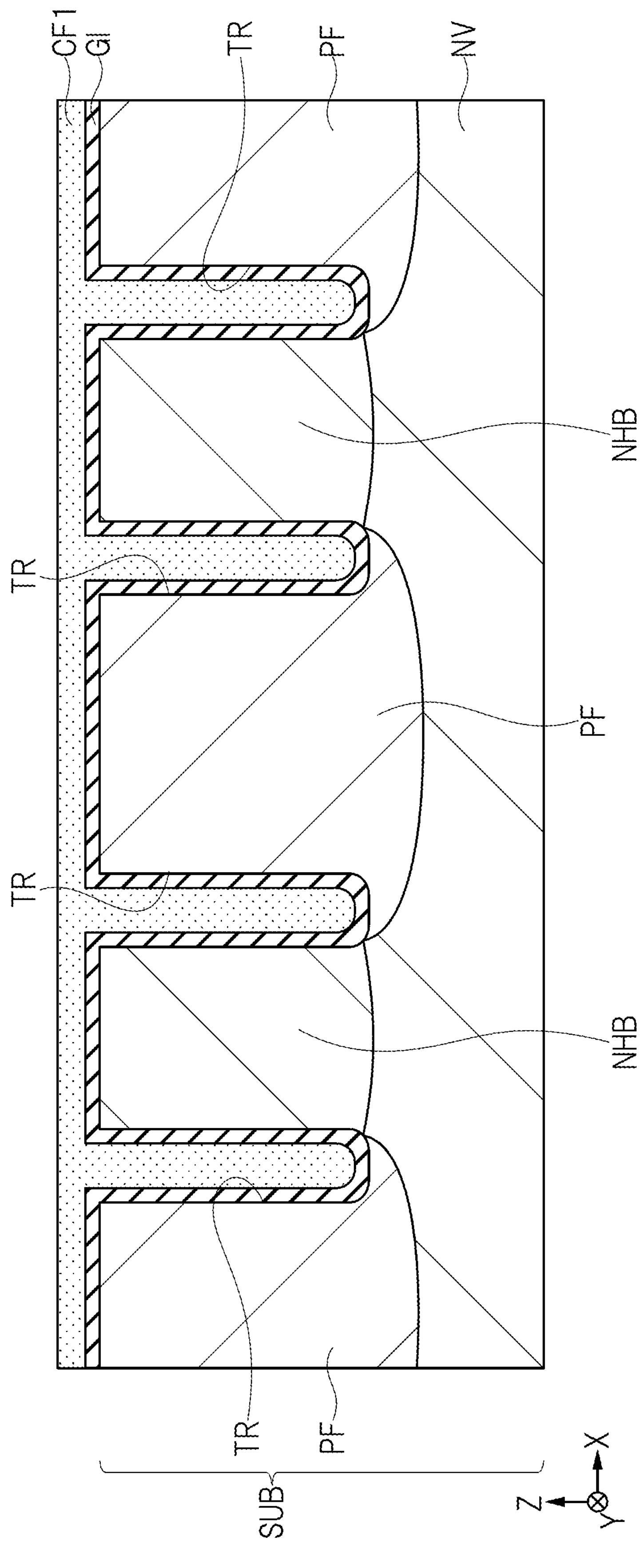
FIG. 9 is a cross-sectional view illustrating a manufacturing process subsequent to FIG. 8.

As illustrated in FIG. 9, the heat treatment is performed on the semiconductor substrate SUB. This heat treatment is performed, for example, in an atmosphere filled with an inert gas such as nitrogen gas under the condition of 1000° C. or more and 1200° C. or less and 80 minutes or more and 120 minutes or less. By this heat treatment, the impurities contained in each of the floating region PF and the hole barrier region NHB are further diffused so that the floating region PF covers the bottom portion of the trench TR.

Next, the gate insulating film GI is formed inside the trench TR and on the upper surface of the semiconductor substrate SUB by a thermal oxidation method. Next, the conductive film CF1 is formed inside the trench TR and on the upper surface of the semiconductor substrate SUB by, for example, the CVD method so as to fill the inside of the trench TR via the gate insulating film GI. The conductive film CF1 is, for example, a polycrystalline silicon film into which an n-type impurity is introduced. The gate insulating film GI may be a laminated film of a relatively thin silicon oxide film formed by a thermal oxidation method and a relatively thick silicon oxide film formed by the CVD method.

Figure 10:
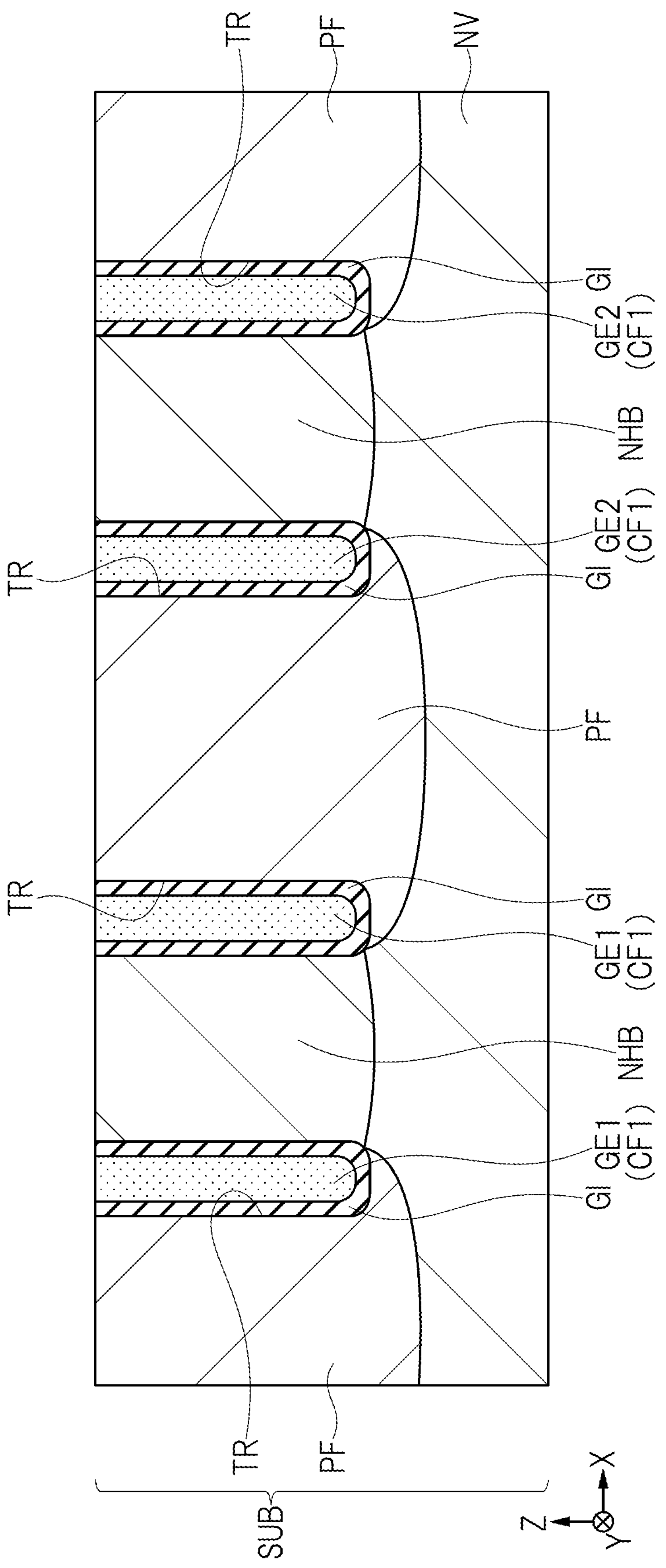
FIG. 10 is a cross-sectional view illustrating a manufacturing process subsequent to FIG. 9.

As illustrated in FIG. 10, first, the conductive film CF1 formed outside the trench TR is removed by anisotropic etching processing. The conductive film CF1 embedded in the trench TR is left as the gate electrodes GE1 and GE2. Next, the gate insulating film GI formed outside the trench TR is removed by isotropic etching processing.

Figure 11:
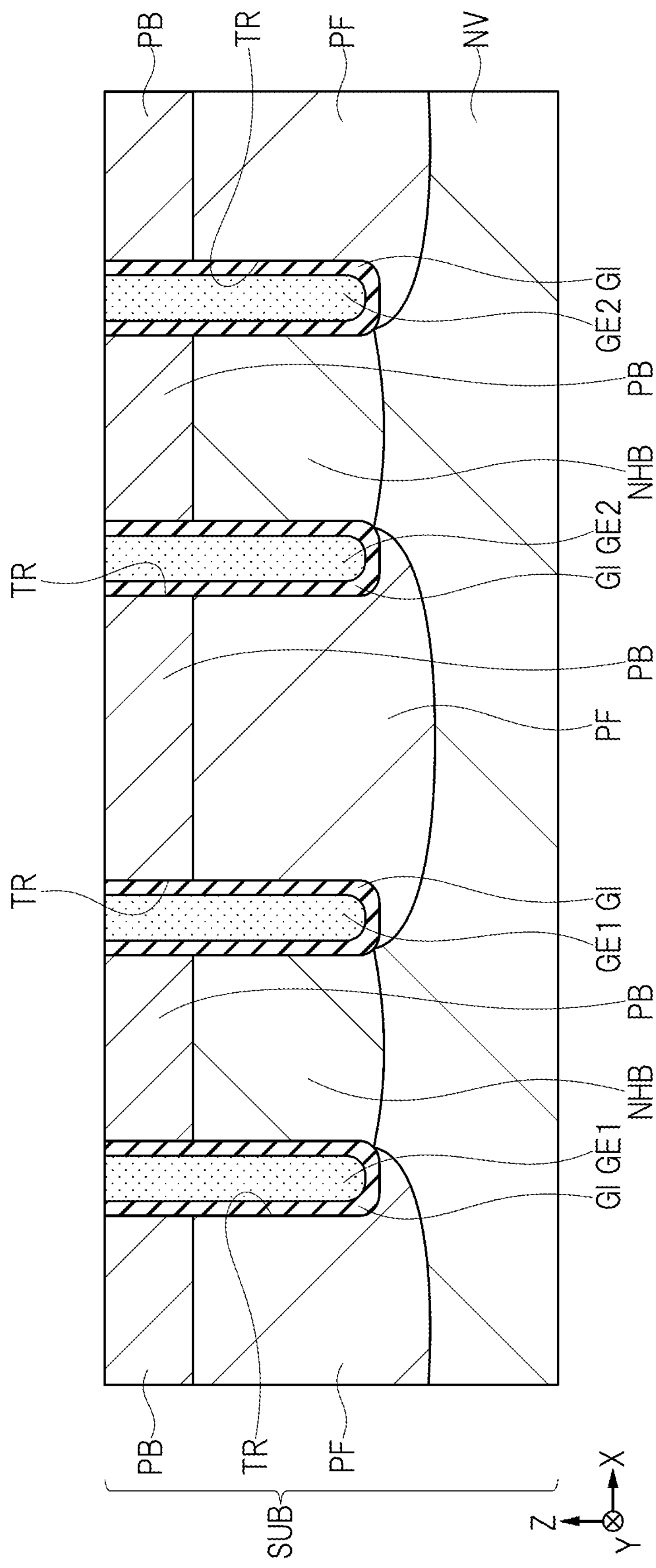
FIG. 11 is a cross-sectional view illustrating a manufacturing process subsequent to FIG. 10.

As illustrated in FIG. 11, the p-type base region PB is formed in the semiconductor substrate SUB (floating region PF and hole barrier region NHB) on the upper surface side of the semiconductor substrate SUB by the photolithography technique and the ion implantation method. For ion implantation of the base region PB, for example, boron (B) is used as the p-type impurity.

Figure 12:
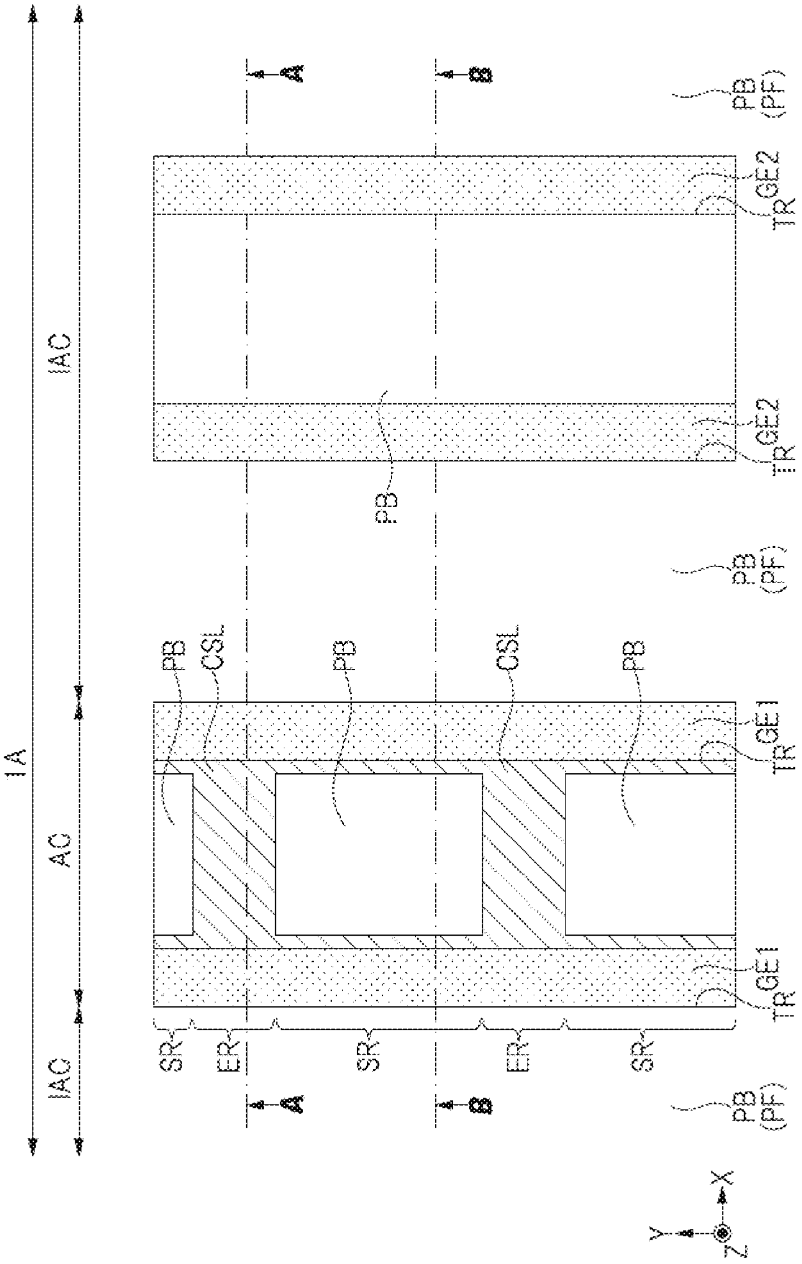
FIG. 12 is a plan view of a main part illustrating a manufacturing process subsequent to FIG. 11.
Figure 13:
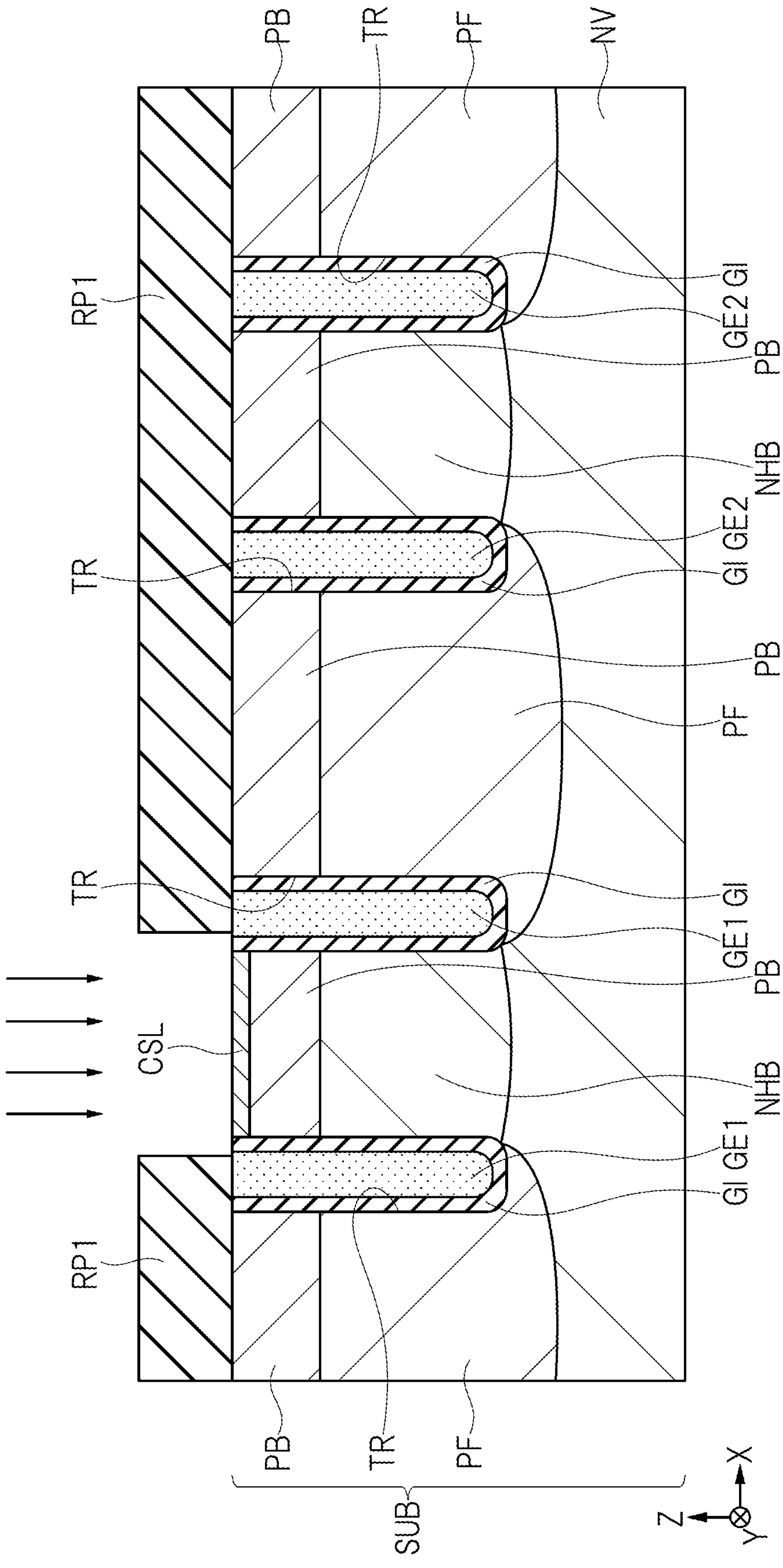
FIG. 13 is a cross-sectional view illustrating a manufacturing process subsequent to FIG. 11.
Figure 14:
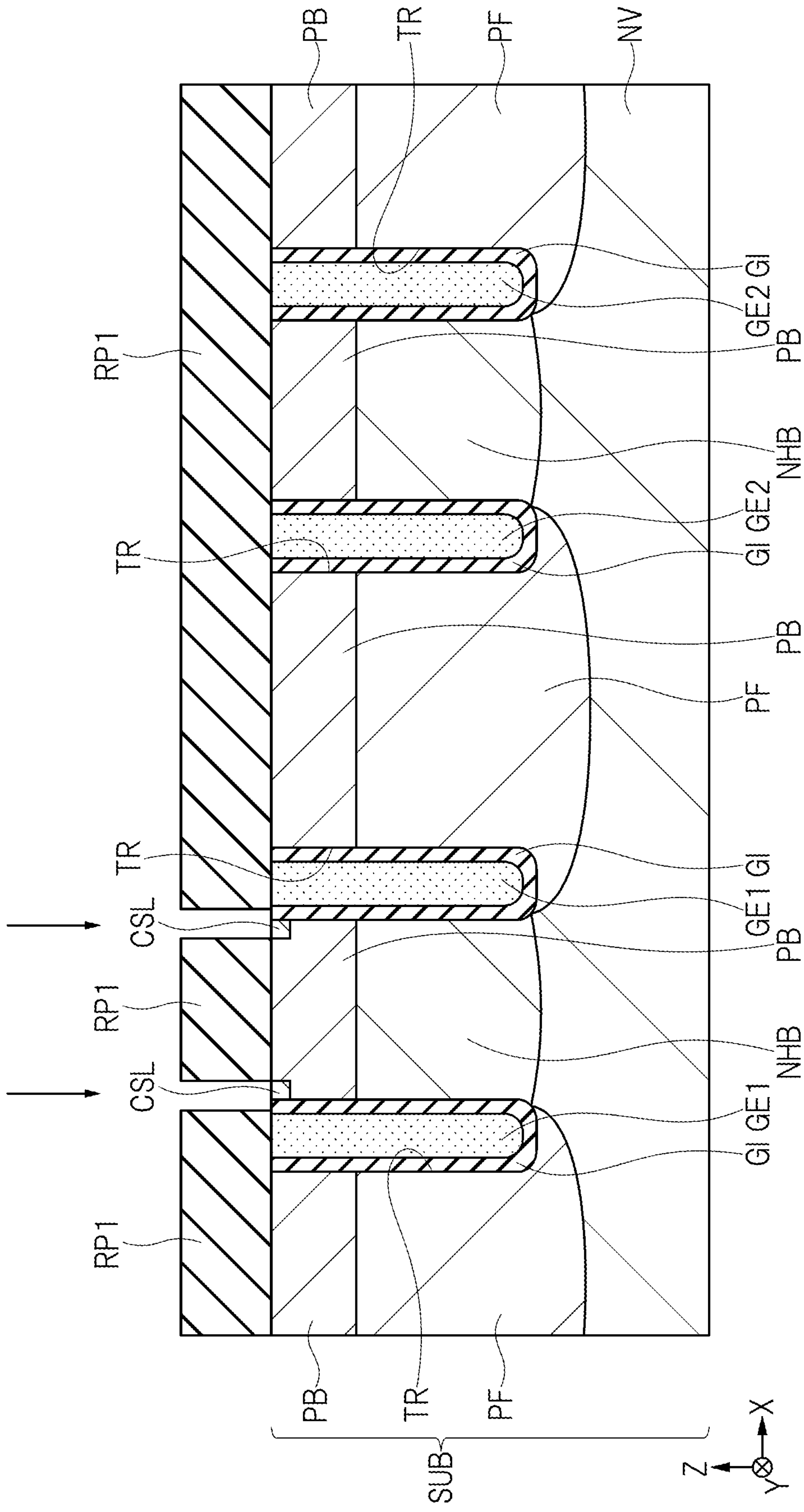
FIG. 14 is a cross-sectional view illustrating a manufacturing process subsequent to FIG. 11.

FIGS. 12 to 14 illustrate a manufacturing process for forming the n-type impurity region CSL. First, as illustrated in FIGS. 13 and 14, the resist pattern RP1 is formed on the upper surface of the semiconductor substrate SUB. The resist pattern RP1 has a pattern that opens the entire emitter formation region ER and a portion in contact with the trench TR in the separation region SR.

Next, by performing ion implantation using the resist pattern RP1 as a mask, for example, arsenic (As) ions are implanted as the n-type impurities into the semiconductor substrate SUB in the emitter formation region ER and into the semiconductor substrate SUB at a portion of the separation region SR in contact with the trench TR. As a result, the impurity region CSL having a planar pattern as illustrated in FIG. 12 is formed.

Next, the resist pattern RP1 is removed by ashing processing. Thereafter, the semiconductor substrate SUB is subjected to heat treatment to activate the impurities included in each of the base region PB and the impurity region CSL. The heat treatment for activating impurities is performed, for example, in an atmosphere filled with an inert gas such as nitrogen gas under the condition of 900° C. or more and 1000° C. or less and 30 seconds or more and 50 seconds or less.

Note that either the step of forming the base region PB or the step of forming the impurity region CSL may precede.

Figure 15:
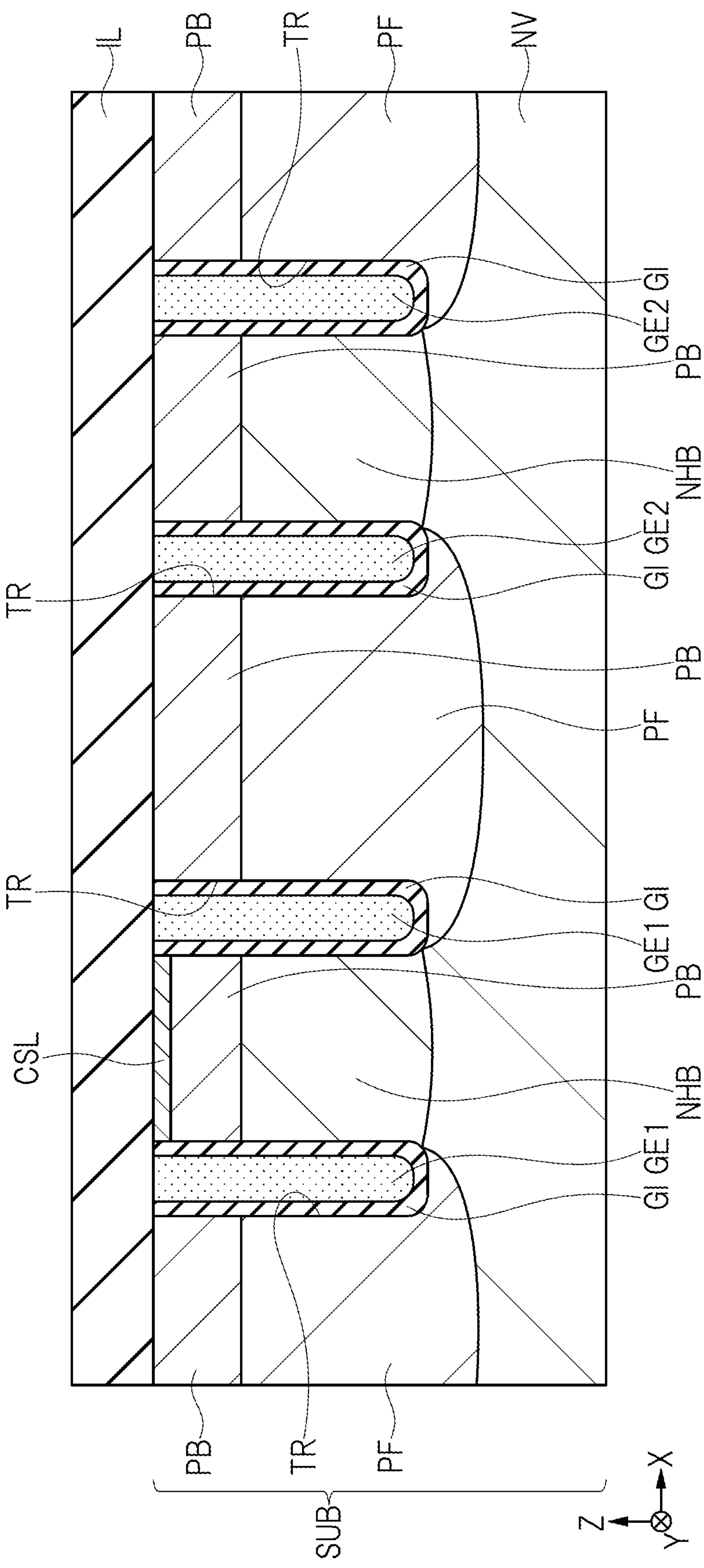
FIG. 15 is a cross-sectional view illustrating a manufacturing process subsequent to FIGS. 12 to 14.

As illustrated in FIG. 15, the interlayer insulating film IL is formed on the upper surface of the semiconductor substrate SUB by, for example, the CVD method so as to cover the trench TR. The interlayer insulating film IL is, for example, a silicon oxide film.

Figure 16:
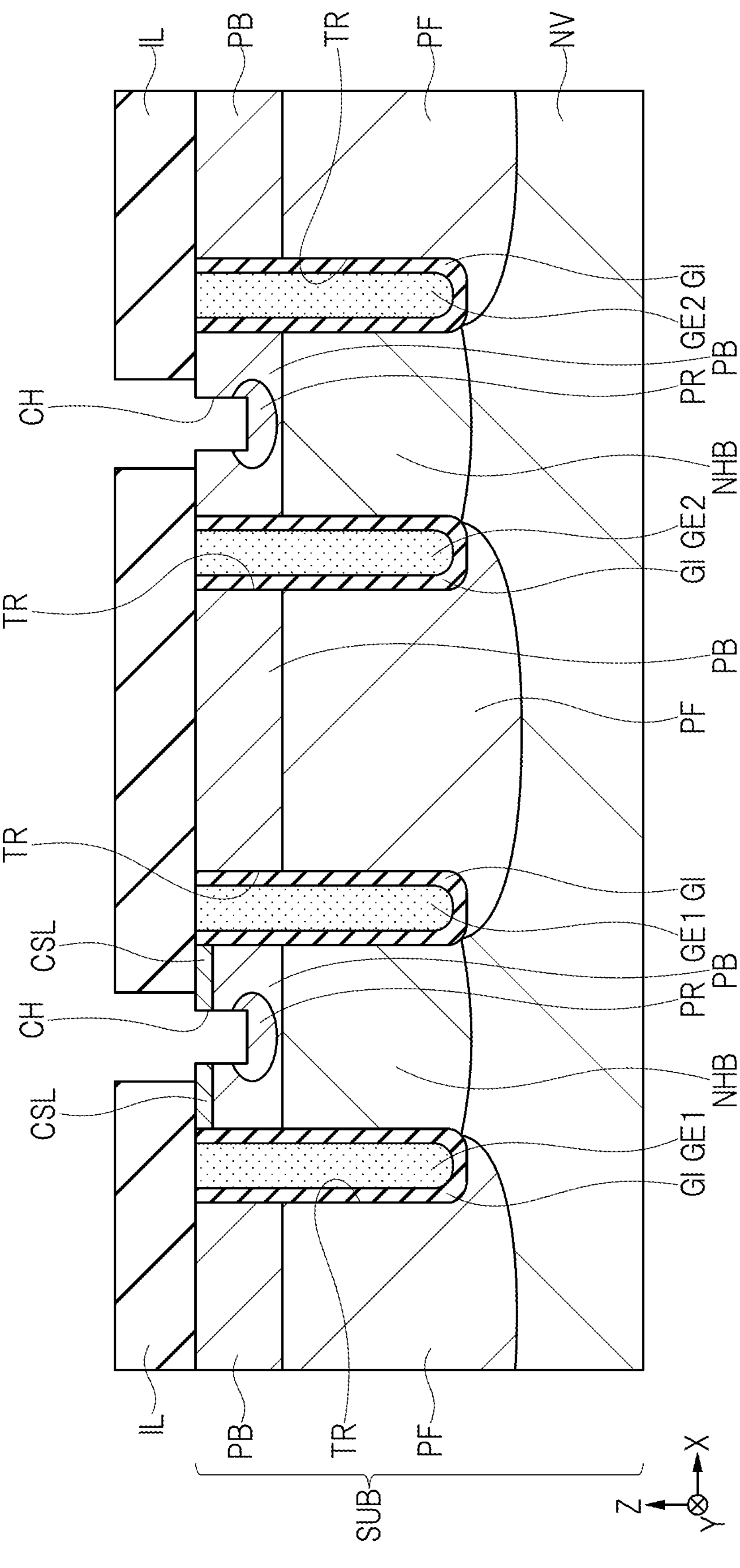
FIG. 16 is a cross-sectional view illustrating a manufacturing process subsequent to FIG. 15.

As illustrated in FIG. 16, a hole CH is formed in the interlayer insulating film IL and the semiconductor substrate SUB so as to penetrate the impurity region CSL and reach the inside of the base region PB in the active cell AC by the photolithography technique and the anisotropic etching processing. At the same time, also in the inactive cell IAC, the holes CH are formed in the interlayer insulating film IL and the semiconductor substrate SUB. Although not illustrated, the hole CH is also formed on a part of each of the gate electrode GE1 and the gate electrode GE2.

Next, the p-type high-concentration diffusion region PR is formed in the base region PB at the bottom of the hole CH by a photolithography technique and an ion implantation method. For ion implantation of the high-concentration diffusion region PR, for example, boron difluoride ($BF_2$) is used as the p-type impurity. Next, isotropic etching processing is performed on the interlayer insulating film IL to retract the interlayer insulating film IL. As a result, the opening width of the hole CH located on the upper surface of the semiconductor substrate SUB is larger than the opening width of the hole CH located inside the semiconductor substrate SUB.

Figure 17:
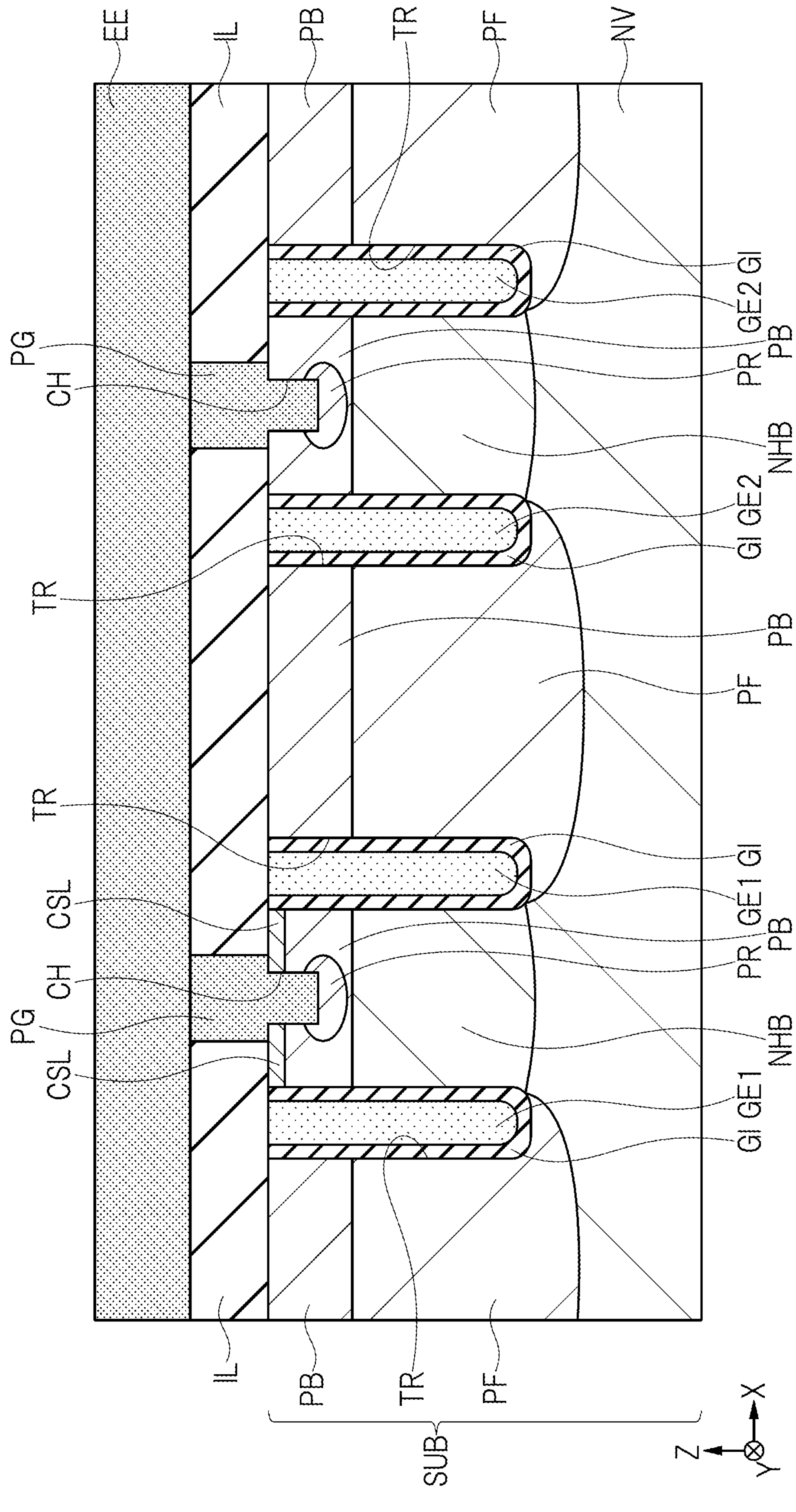
FIG. 17 is a cross-sectional view illustrating a manufacturing process subsequent to FIG. 16.

As illustrated in FIG. 17, the plug PG is formed inside the hole CH, and the emitter electrode EE is formed on the interlayer insulating film IL. First, a barrier metal film is formed inside the hole CH and on the interlayer insulating film IL. For example, the barrier metal film can be formed by forming a titanium film inside the hole CH and on the interlayer insulating film IL by a sputtering method, and forming a titanium nitride film on the titanium film by a sputtering method, for example. Next, a conductive film made of, for example, a tungsten film is formed on the barrier metal film by, for example, the CVD method so as to fill the inside of the hole CH. Next, the conductive film and the barrier metal film formed outside the hole CH are removed by anisotropic etching processing. As a result, the plug PG is formed so as to fill the inside of the hole CH.

Next, a TiW film is formed on the interlayer insulating film IL by, for example, a sputtering method, and an aluminum alloy film is formed on the TiW film by, for example, a sputtering method. Next, the emitter electrode EE is formed by patterning the TiW film and the aluminum alloy film by a photolithography technique and an anisotropic etching process. Note that the gate wiring GW is also formed on the interlayer insulating film IL in the same process as the process of forming the emitter electrode EE.

Thereafter, the structure shown in FIGS. 3 and 4 is obtained through the following manufacturing processes. First, the lower surface of the semiconductor substrate SUB is polished as necessary. Next, ion implantation is performed from the lower surface side of the semiconductor substrate SUB to form the n-type field stop region NS and the p-type collector region PC. By performing laser annealing after the ion implantation, impurities included in the field stop region NS and the collector region PC are activated. Next, a metal film such as an Au film, a Ni film, a Ti film, or an AlSi film is formed under the lower surface of the semiconductor substrate SUB by, for example, a sputtering method. This metal film serves as the collector electrode CE. The collector electrode CE may be a laminated film obtained by appropriating laminating the above-described metal films.

In the first embodiment, the impurity region CSL of the emitter formation region ER functions as the emitter region of the IGBT. Since the impurity region CSL of the emitter formation region ER and the impurity region CSL of the separation region SR are formed in the same manufacturing process, there is no need to add a new manufacturing process, and an increase in manufacturing cost can be suppressed.

For example, although the impurity region NE functions as an emitter region of the IGBT in the study example (FIG. 39), the impurity region CSL of the first embodiment can be formed only by changing a mask for forming the impurity region NE of the study example. Therefore, an increase in manufacturing cost can be suppressed.

First Modification

Figure 18:
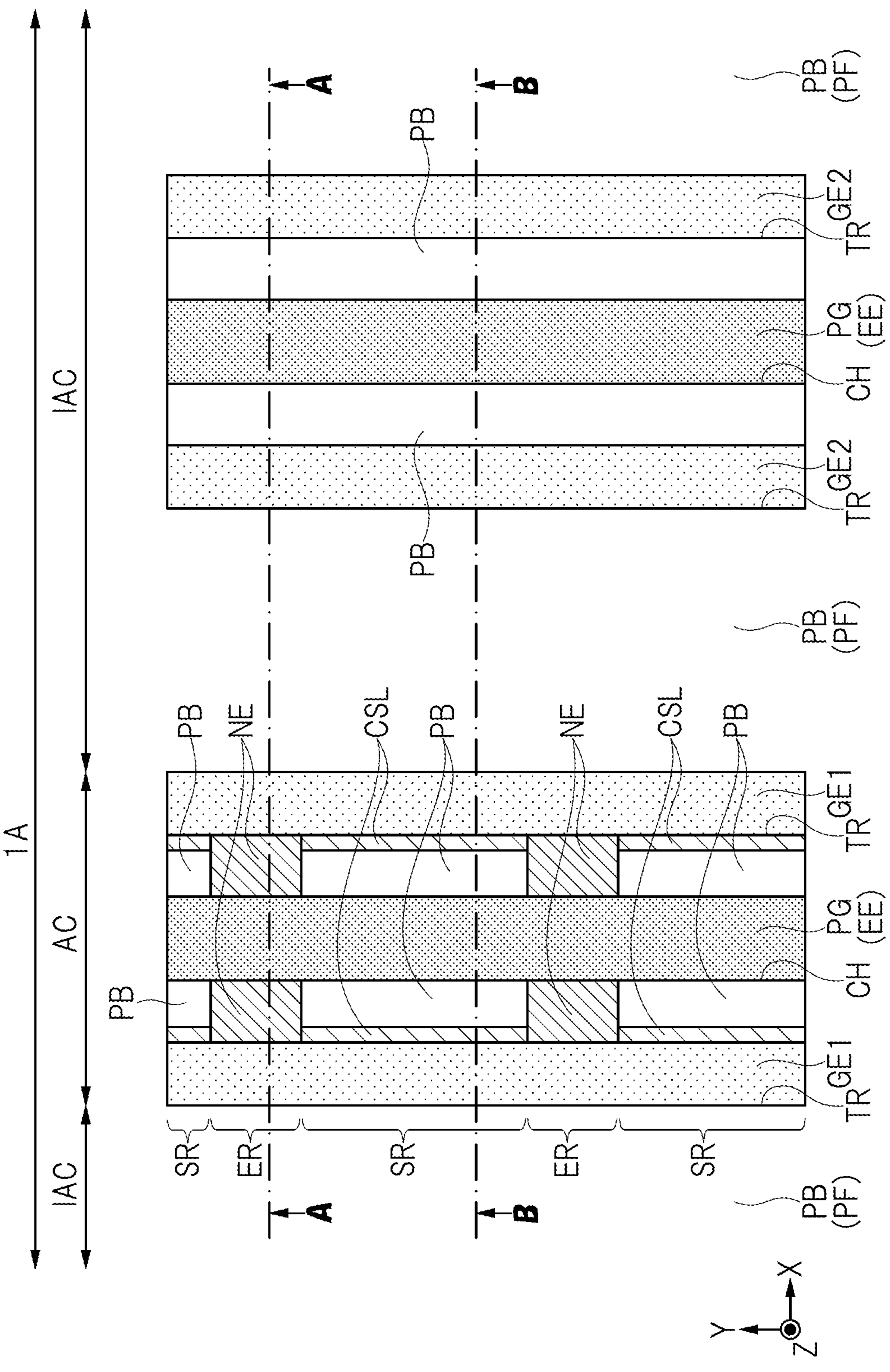
FIG. 18 is a plan view of a main part illustrating a semiconductor device according to the first modification.
Figure 19:
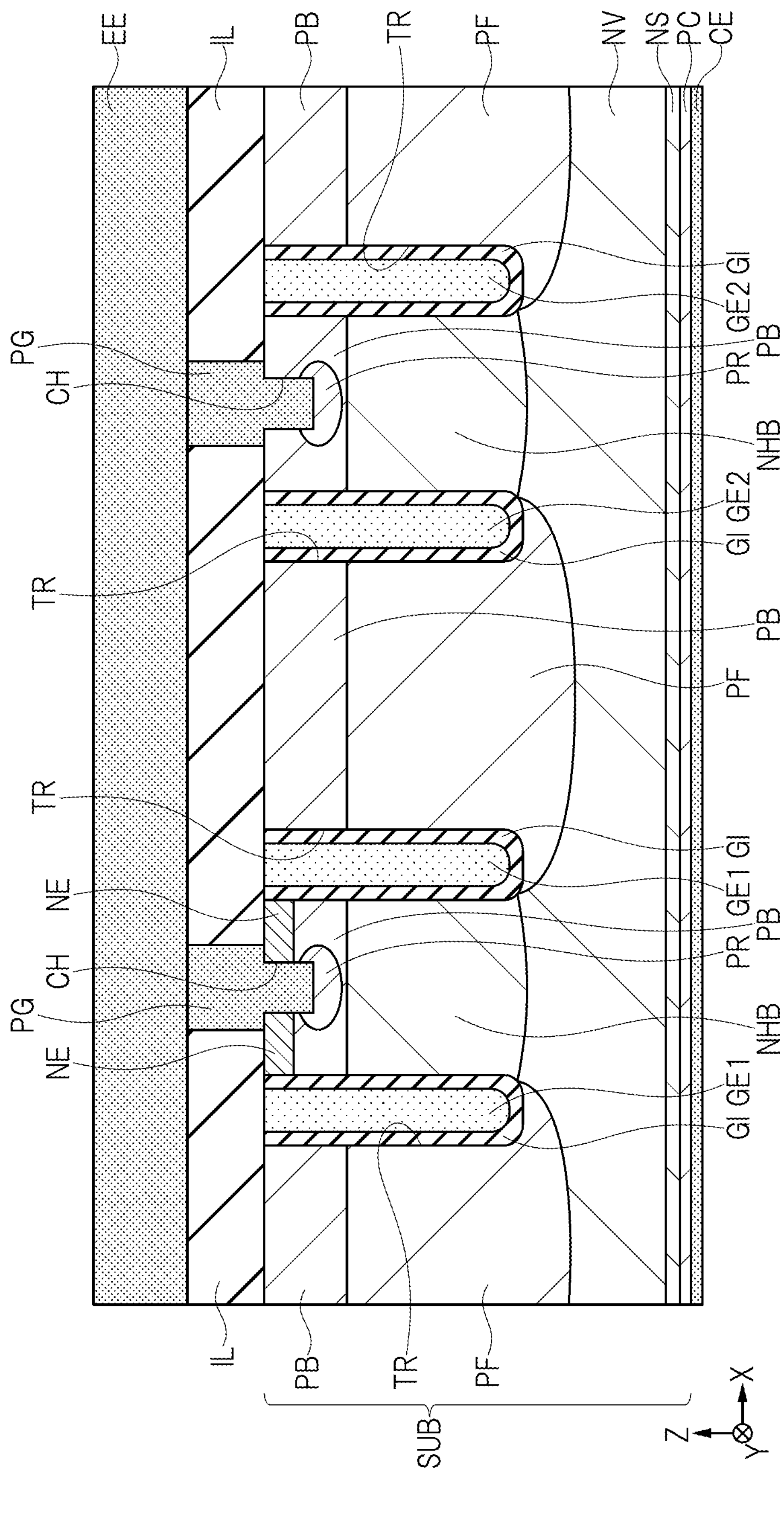
FIG. 19 is a cross-sectional view illustrating a semiconductor device according to the first modification.

FIGS. 18 and 19 illustrate the semiconductor device 100 according to a first modification of the first embodiment. As illustrated in FIGS. 18 and 19, in the first modification, the n-type impurity region NE is formed in the emitter formation region ER. The impurity concentration of the impurity region NE is higher than the impurity concentration of the impurity region CSL, and is, for example, $1\times10^{13}$ $cm^{-3}$ or more and $1\times10^{21}$ $cm^{-3}$ or less. The impurity concentration of the impurity region NE is set to such a concentration that an ohmic contact with the plug PG is established.

When the contact resistance between the impurity region CSL and the plug PG is large in the emitter formation region ER, the contact resistance can be reduced by providing such a high-concentration impurity region NE.

Figure 20:
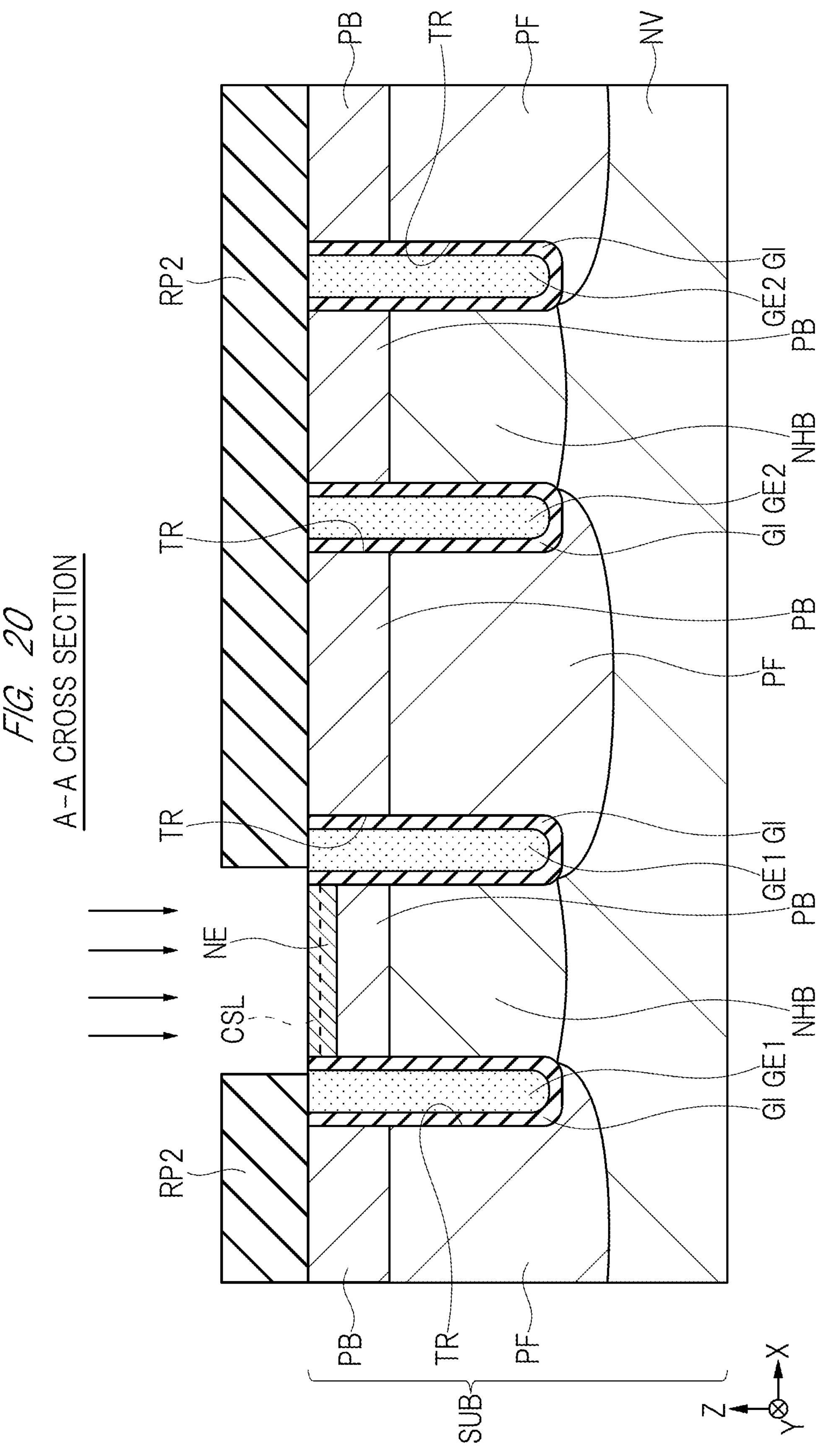
FIG. 20 is a cross-sectional view illustrating a manufacturing process of the semiconductor device according to the first modification.

FIG. 20 illustrates a manufacturing process for forming the impurity region NE. After the manufacturing processes of FIGS. 12 to 14, as illustrated in FIG. 20, resist pattern RP2 is formed on the upper surface of the semiconductor substrate SUB. The resist pattern RP2 has a pattern that opens the entire emitter formation region ER.

Next, by performing ion implantation using the resist pattern RP2 as a mask, for example, arsenic (As) ions are implanted as the n-type impurities into the semiconductor substrate SUB in the emitter formation region ER. As a result, an impurity region NE having a planar pattern as illustrated in FIG. 20 is formed. Thereafter, the resist pattern RP2 is removed by ashing processing.

The impurity region CSL contains impurities ion-implanted in the manufacturing process of FIGS. 12 to 14. The impurity region NE includes impurities ion-implanted in the manufacturing process of FIGS. 12 to 14 and impurities ion-implanted in the manufacturing process of FIG. 20. Finally, the amount of impurities due to ion implantation in FIG. 20 is adjusted so that the impurity concentration of the impurity region NE falls within the above numerical values.

Note that any one of forming of the base region PB, forming of the impurity region CSL, and forming of the impurity region NE may precede the other. The heat treatment for activating impurities is performed after formation of these regions.

Second Modification

Figure 21:
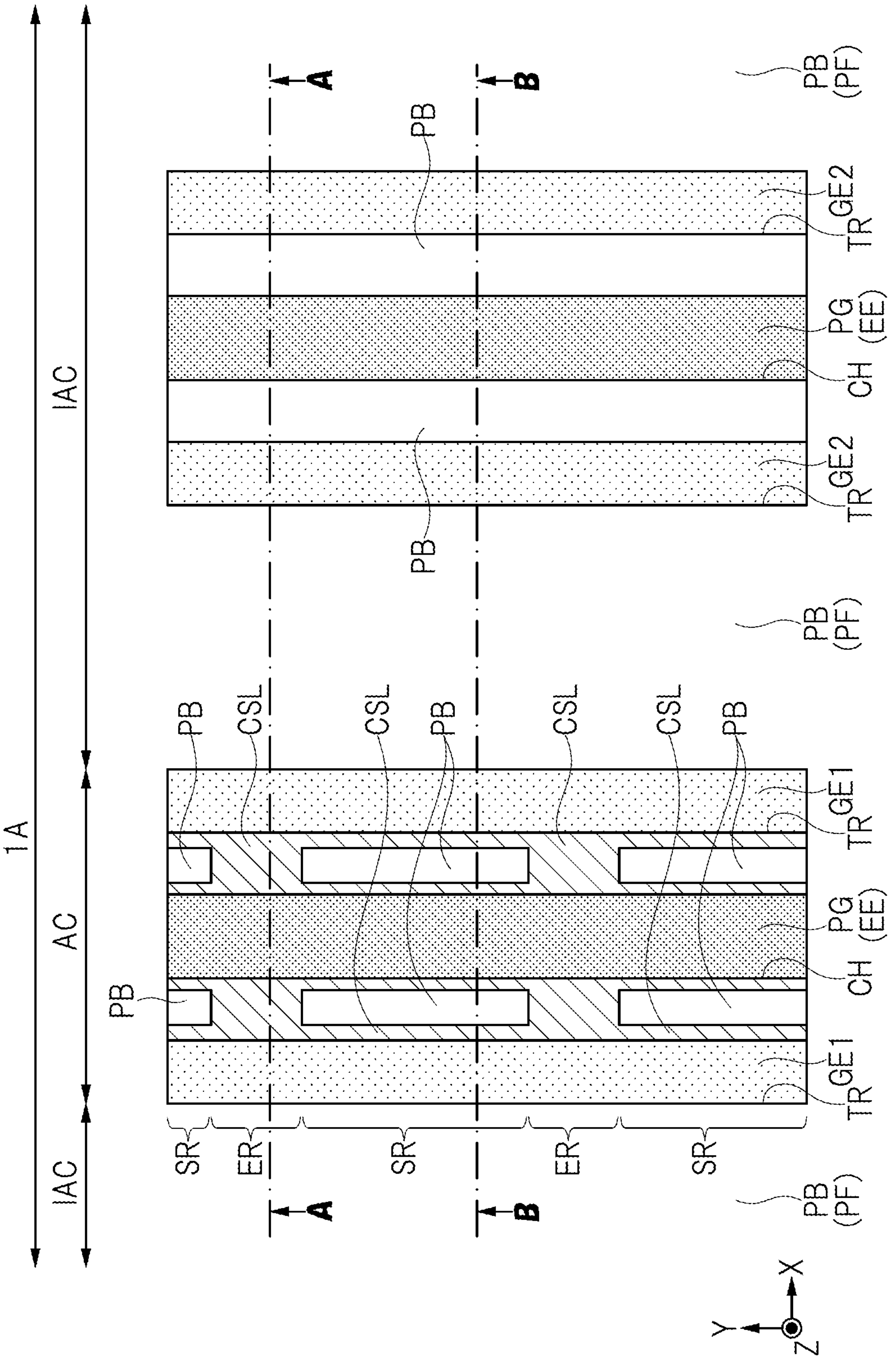
FIG. 21 is a plan view of a main part illustrating a semiconductor device according to the second modification.
Figure 22:
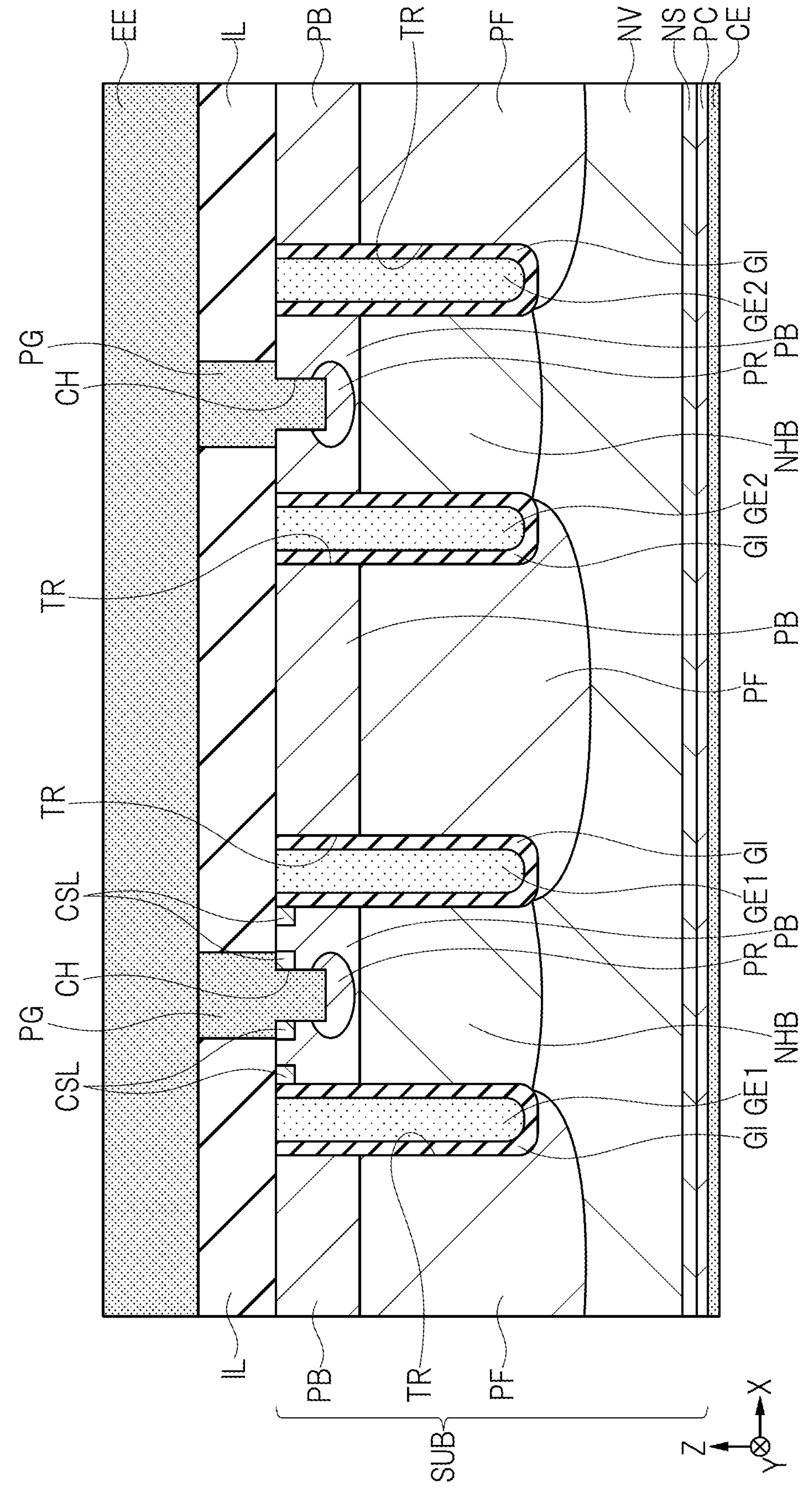
FIG. 22 is a cross-sectional view illustrating a semiconductor device according to the second modification.

FIG. 21 illustrates the semiconductor device 100 according to a second modification of the first embodiment. As illustrated in FIG. 21, in the second modification, the n-type impurity region CSL is also formed in the base region PB at a position in contact with the hole CH in the separation region SR. Similarly to the impurity region CSL in contact with the trench TR, the impurity region CSL is also connected to the impurity region CSL of the emitter formation region ER.

The impurity region CSL in contact with the hole CH and the impurity region CSL in contact with the trench TR are separated from each other. Therefore, the discharge of holes due to the parasitic PMOS operation in the separation region SR is not inhibited.

Formation of such an impurity region CSL in contact with the hole CH can be achieved by changing the mask used in FIGS. 12 to 14. The resist pattern RP3 is provided with an opening pattern that passes through the vicinity of the center of the separation region SR and extends in the Y direction. If the opening width of the opening pattern covers the opening width of the hole CH, the impurity region CSL as illustrated in FIG. 21 can be formed.

Also in the second modification, the high-concentration impurity region NE may be formed in the emitter formation region ER as in the first modification.

Second Embodiment

Hereinafter, the semiconductor device 100 according to the second embodiment and a method of manufacturing the same will be described with reference to FIGS. 23 to 26. In the following description, differences from the first embodiment will be mainly described, and description of points overlapping with the first embodiment will be omitted.

In the first embodiment, the impurity region CSL is formed using the resist pattern RP1. Therefore, there is a problem that when misalignment of the formation position of the resist pattern RP1 occurs, the width of the impurity region CSL in the X direction fluctuates, and the resistance value as the diffusion layer resistance fluctuates. The second embodiment provides a technique capable of suppressing such a variation in the resistance value.

Figure 25:
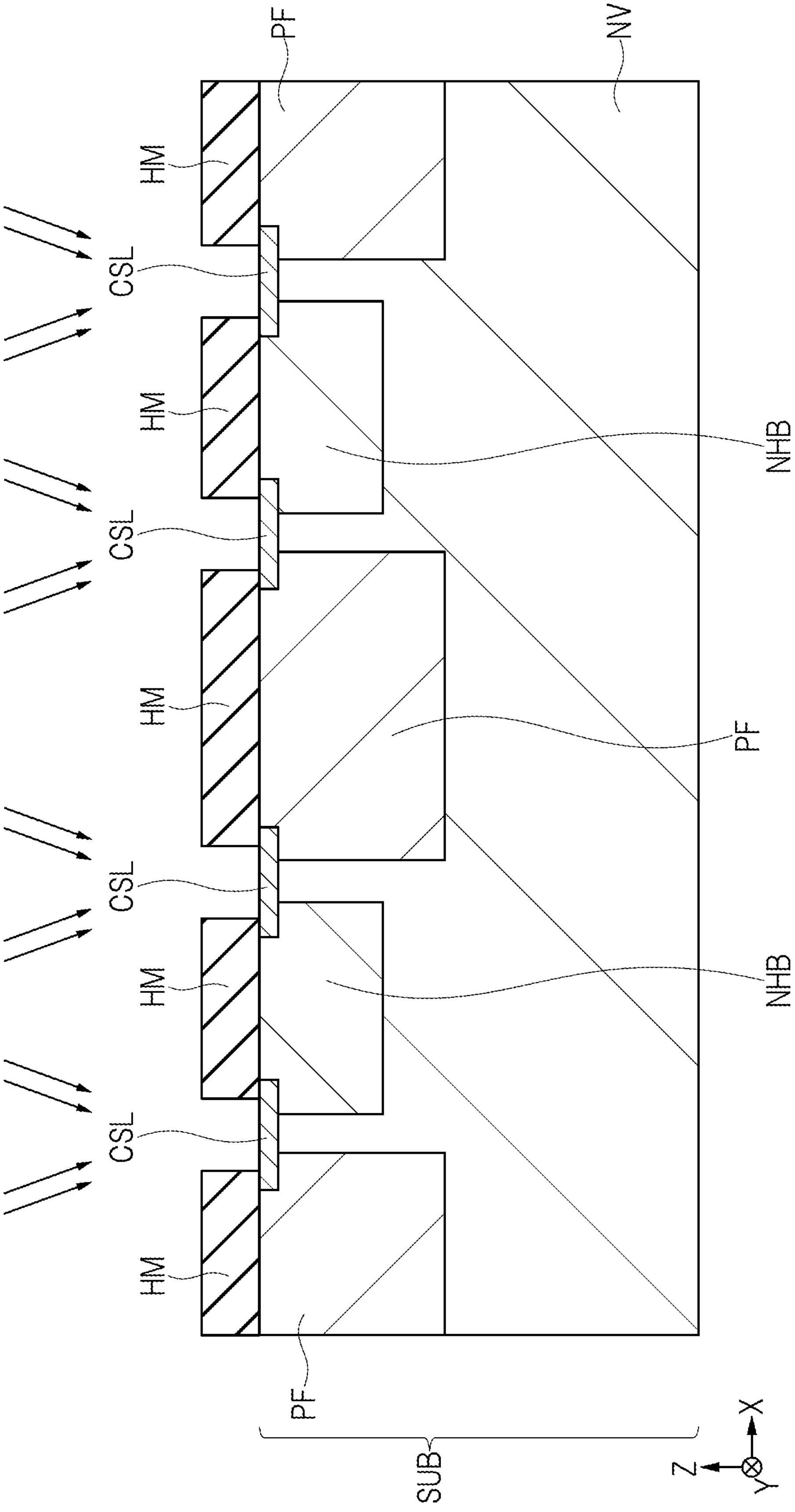
FIG. 25 is a cross-sectional view illustrating the manufacturing process of the semiconductor device according to the second embodiment.

As illustrated in FIG. 25, in FIG. 7, forming of the impurity region CSL by oblique ion implantation is added between forming of the hard mask HM and forming of the trench TR. That is, for example, arsenic (As) ions are implanted as the n-type impurity from an angle inclined with respect to the normal line of the upper surface of the semiconductor substrate SUB. Here, the thickness and implantation energy of the hard mask HM are adjusted so that ions do not pass through the hard mask HM and reach the semiconductor substrate SUB. Thereafter, as illustrated in FIG. 26, the trench TR is formed in the semiconductor substrate SUB.

By performing oblique ion implantation using the hard mask HM as a mask, the impurity region CSL can be formed at a position in contact with the trench TR in a self-aligned manner. Therefore, since a problem due to misalignment of the resist pattern RP1 does not occur, a variation in the width of the impurity region CSL can be suppressed. In addition, since the trench TR is also formed in a self-alignment manner using the same hard mask HM as a mask, the positional relationship between the trench TR and the impurity region CSL is also unlikely to change.

Figure 26:
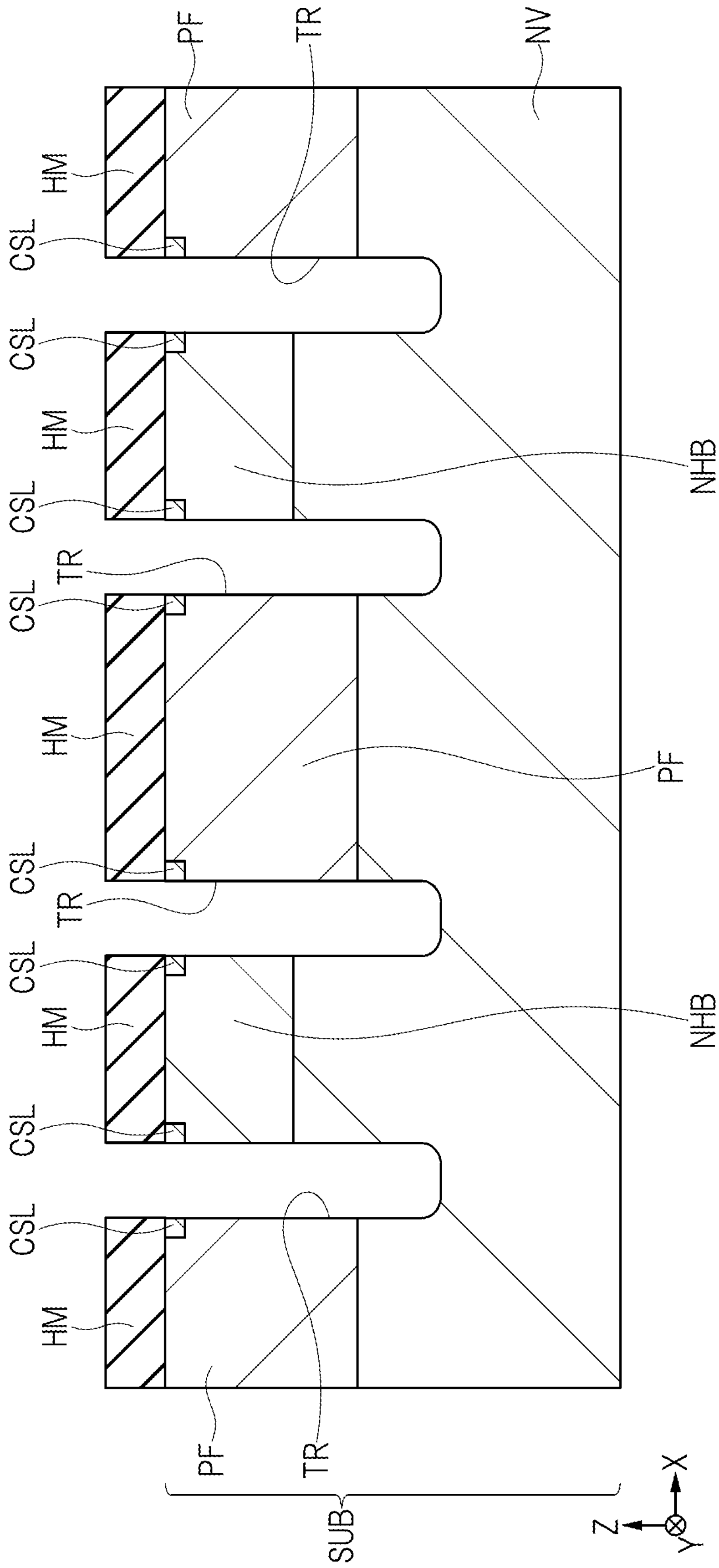
FIG. 26 is a cross-sectional view illustrating a manufacturing process subsequent to FIG. 25.

As illustrated in FIG. 26, in the second embodiment, it is difficult to form the impurity region CSL in the entire emitter formation region ER. Therefore, in order to form the emitter region of the IGBT, it is necessary to perform the ion implantation described in FIG. 20 of the first modification. As a result, as illustrated in FIGS. 23 and 24, the impurity region NE can be formed in the emitter formation region ER.

In the second embodiment, a resist pattern is not used when the impurity region CSL is formed, and a resist pattern RP2 is used when the impurity region NE is formed. Therefore, since the first embodiment and the second embodiment are the same in terms of the number of masks, an increase in manufacturing cost can be suppressed. In the second embodiment, since there is no mask for the impurity region CSL, the number of masks can be reduced as compared with the first modification.

Figure 23:
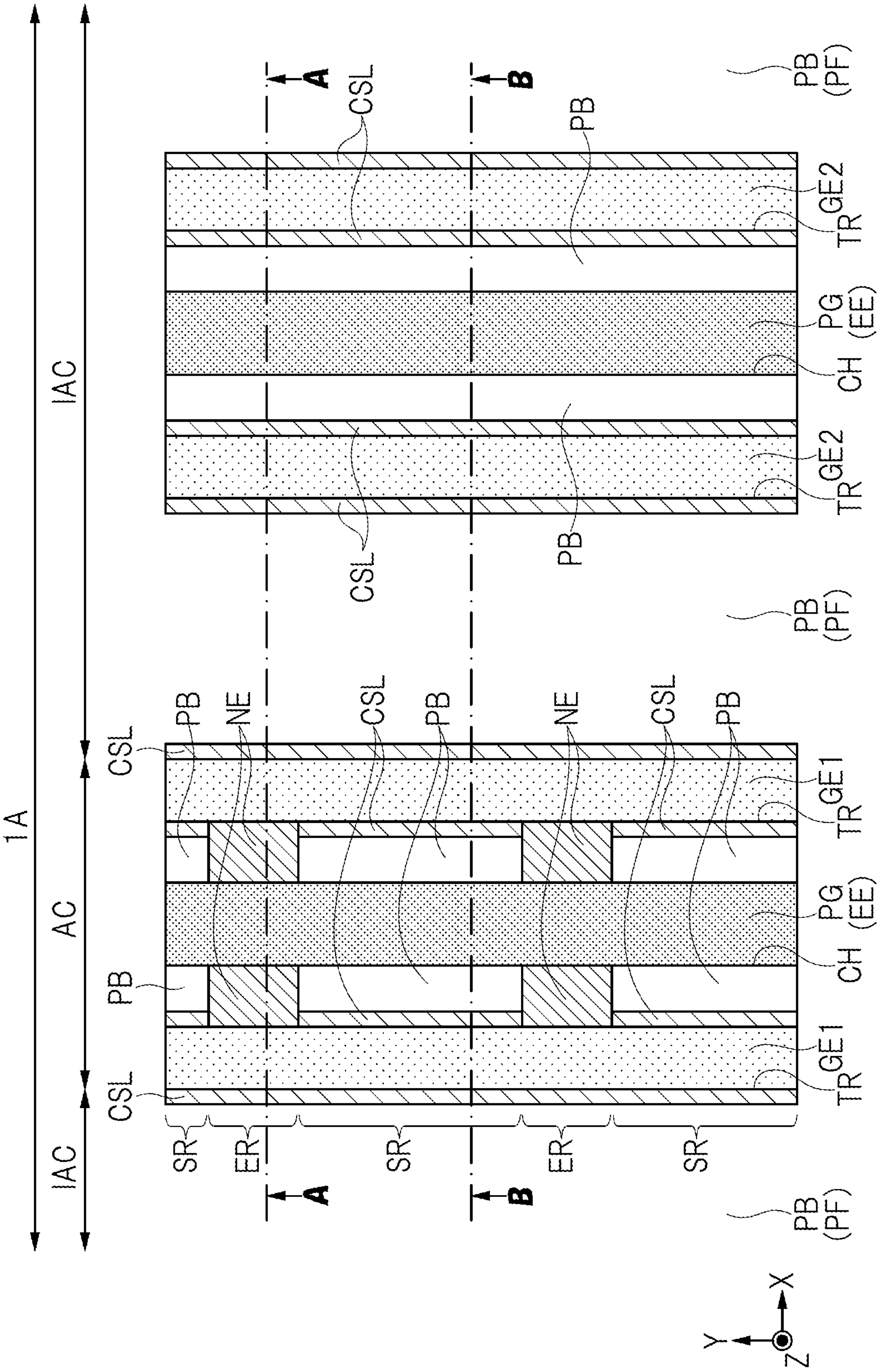
FIG. 23 is a plan view of a main part illustrating a semiconductor device according to the second embodiment.
Figure 24:
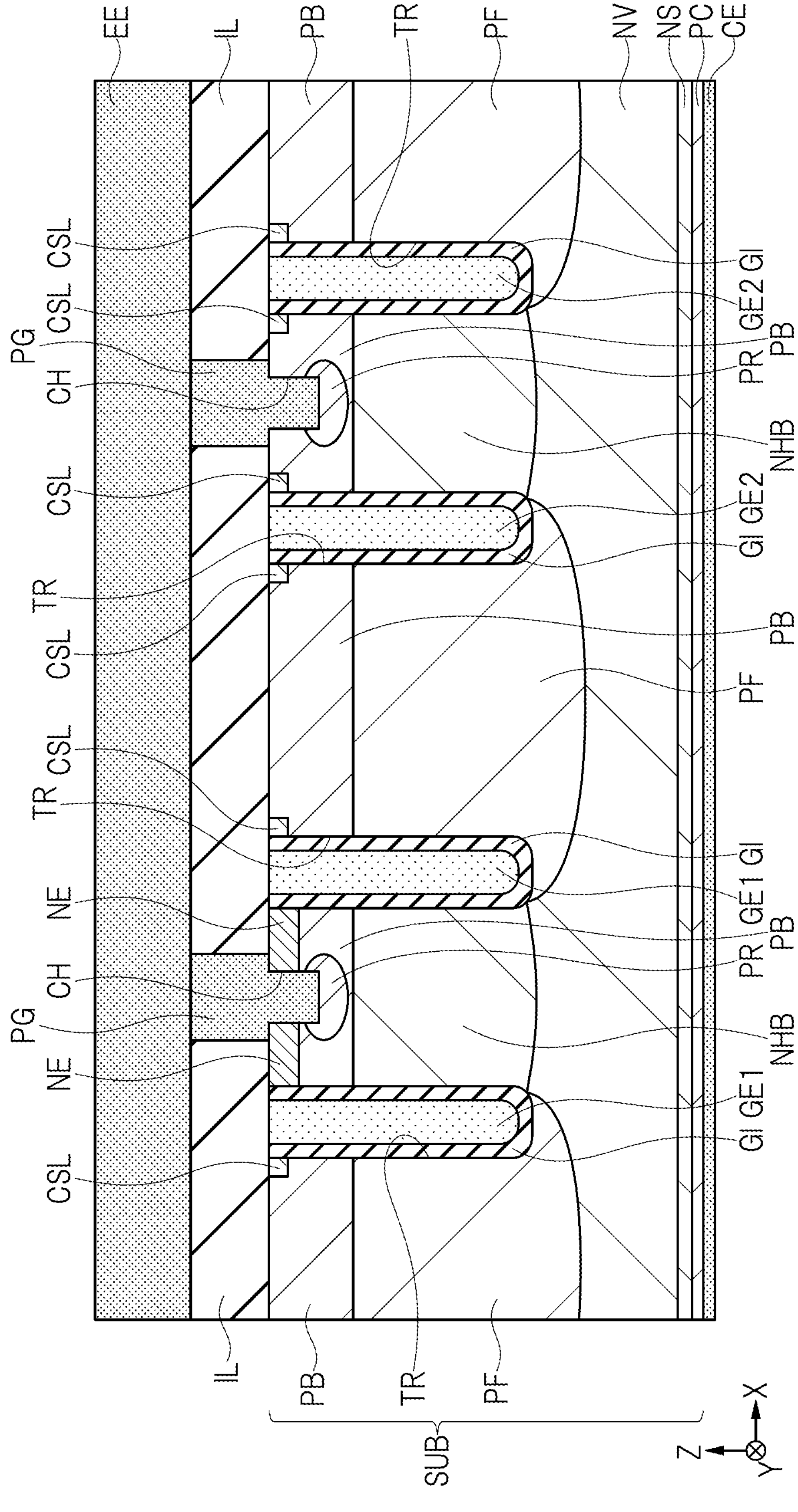
FIG. 24 is a cross-sectional view illustrating a semiconductor device according to the second embodiment.

As illustrated in FIGS. 23 and 24, in the second embodiment, since the impurity region CSL is formed without using a resist pattern, the impurity region CSL is also formed in a part of the base region PB in the floating region PF. However, since the floating region PF is in an electrically floating state, these impurity regions CSL are also in an electrically floating state. Therefore, the characteristics of the IGBT are not particularly affected by these impurity regions CSL.

The impurity region CSL is also formed in the base region PB between the pair of gate electrodes GE2. However, since these impurity regions CSL are physically separated from the hole CH, they are in an electrically floating state. The characteristics of the IGBT are not particularly affected by these impurity regions CSL.

Third Embodiment

Figure 27:
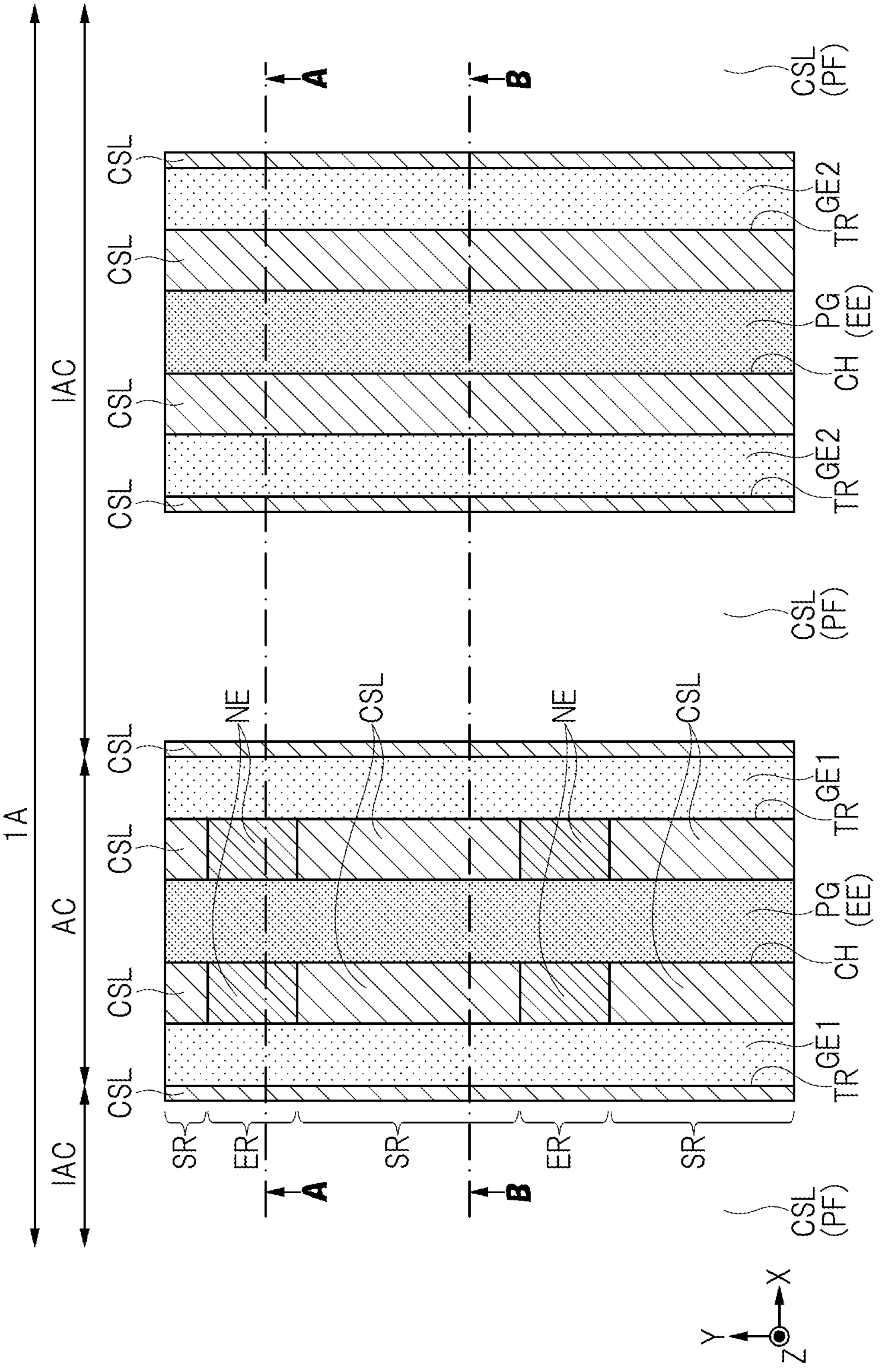
FIG. 27 is a plan view of a main part illustrating a semiconductor device according to a third embodiment.
Figure 28:
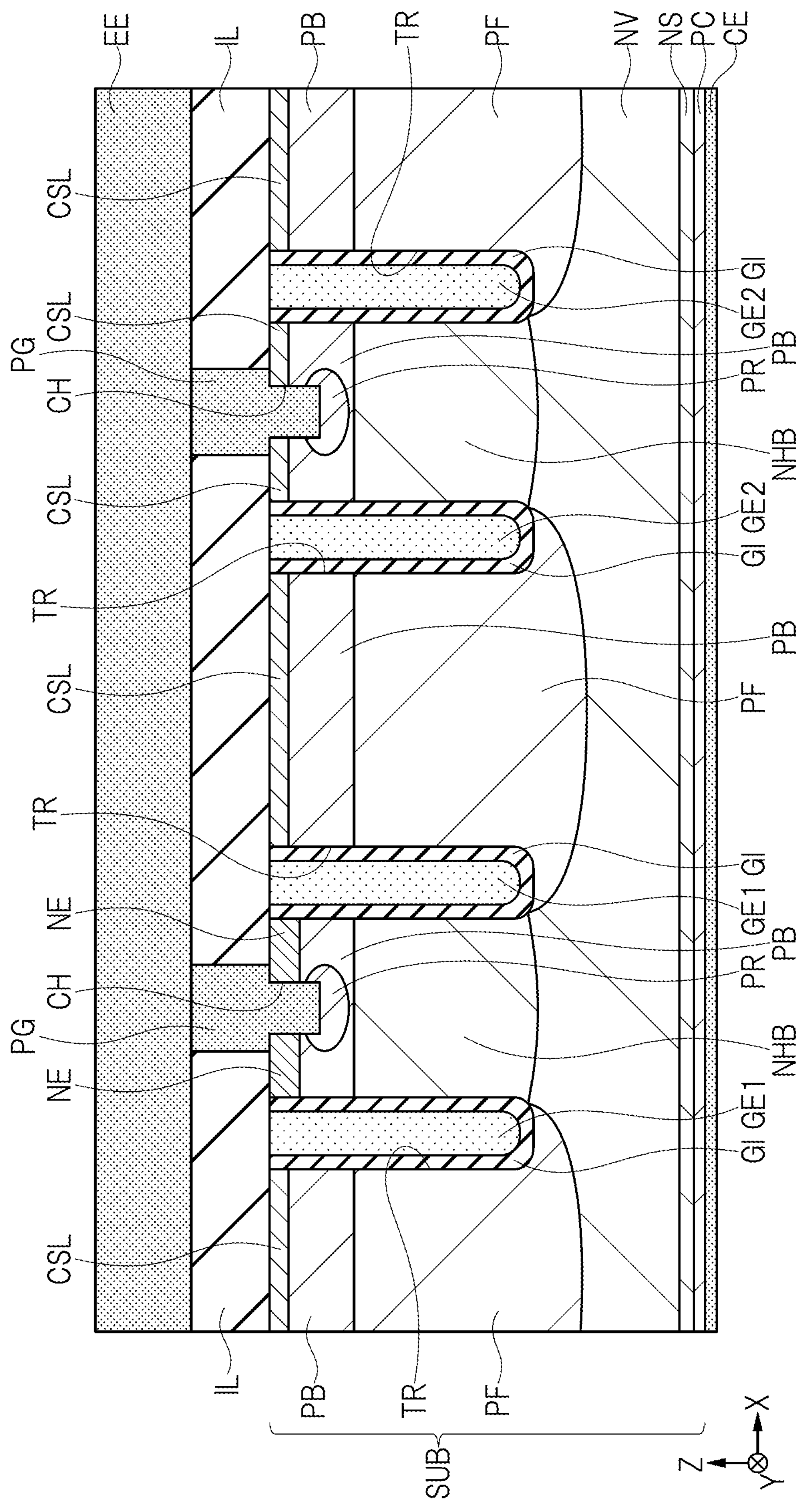
FIG. 28 is a cross-sectional view illustrating a semiconductor device according to the third embodiment.
Figure 29:
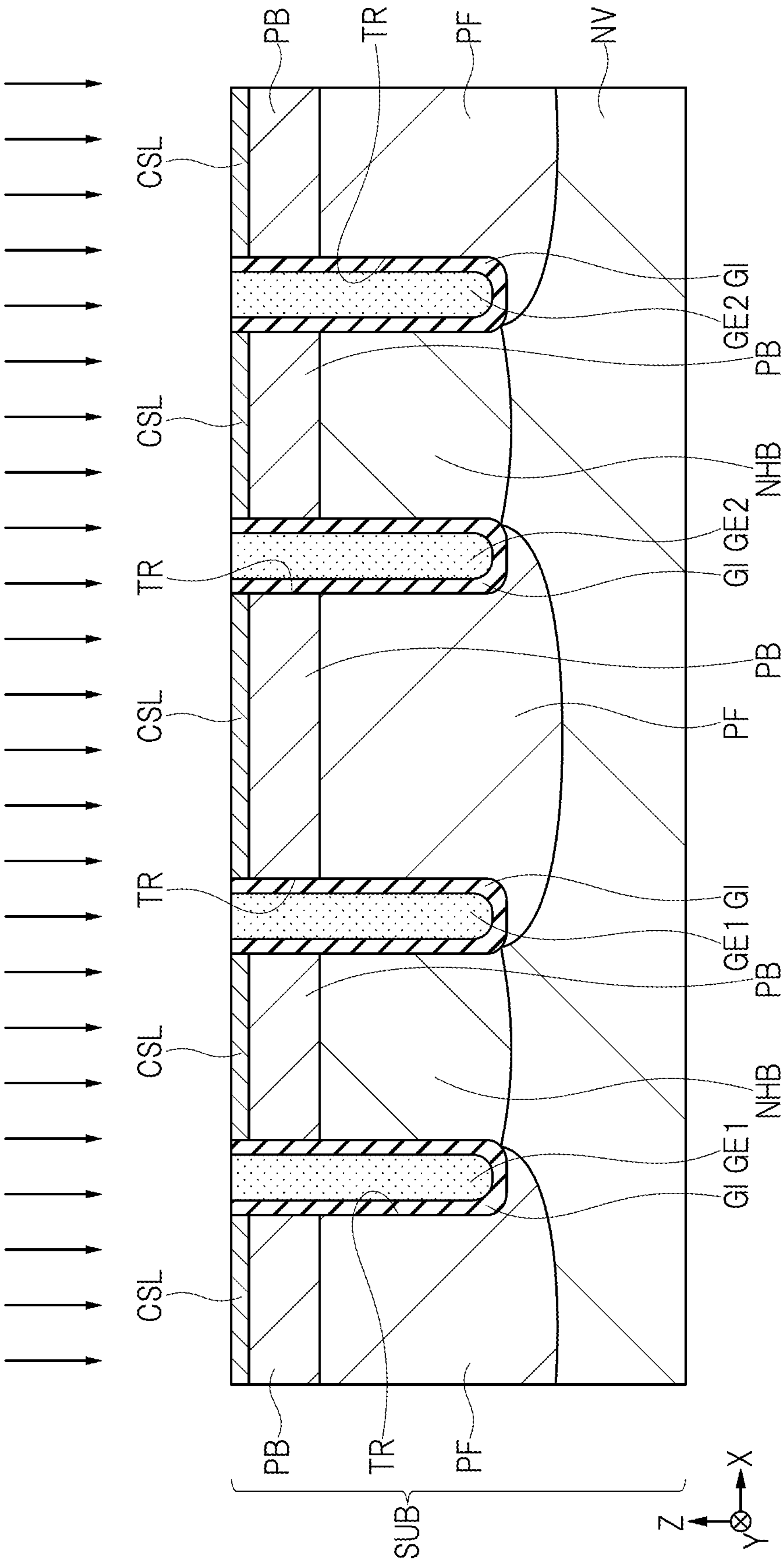
FIG. 29 is a cross-sectional view illustrating the manufacturing process of the semiconductor device according to the third embodiment.

Hereinafter, the semiconductor device 100 according to the third embodiment and a method of manufacturing the same will be described with reference to FIGS. 27 to 29. In the following description, differences from the first embodiment will be mainly described, and description of points overlapping with the first embodiment will be omitted.

The impurity region CSL in the third embodiment is formed not only in a portion of the separation region SR in contact with the pair of trenches TR, but also in the entire semiconductor substrate SUB (in the base region PB) of the active cell AC and the inactive cell IAC. However, in the third embodiment, the impurity concentration of the impurity region CSL is set to such a concentration that ohmic contact with the plug PG is not established. The impurity concentration of the impurity region CSL is, for example, $1\times10^{12}/cm^3$ or more and $1\times10^{14}/cm^3$ or less.

The low-concentration impurity region CSL as in the third embodiment can also function as a diffusion layer resistance, and electrons are easily supplied to the vicinity of the center of the separation region SR. Therefore, the switching loss can be reduced, and the performance of the semiconductor device 100 can be improved.

The formation of the impurity region CSL according to the third embodiment can be achieved by performing ion implantation into the semiconductor substrates SUB of the active cell AC and the inactive cell IAC without forming the resist pattern RP1 in the manufacturing processes of FIGS. 12 to 14. Therefore, since the number of masks can be reduced, the manufacturing cost can be suppressed as compared with the first embodiment. However, since the impurity region CSL has a lower concentration than that of the first embodiment, the first embodiment is superior to the third embodiment in terms of improvement of the supply amount of electrons and reduction of switching loss.

In the third embodiment, the impurity region CSL is formed in a part of the base region PB in the floating region PF, but the characteristics of the IGBT are not particularly affected for the same reason as in the second embodiment. Further, the impurity region CSL is also formed in the base region PB between the pair of gate electrodes GE2, but the impurity region CSL is not in ohmic contact with the plug PG, so that the characteristics of the IGBT are not particularly affected by these impurity regions CSL.

In addition, since the impurity region CSL is not in ohmic contact with the plug PG, in the third embodiment, it is necessary to perform the ion implantation described in FIG. 20 of the first modification in order to form the emitter region of the IGBT. As a result, as illustrated in FIGS. 27 and 28, the impurity region NE can be formed in the emitter formation region ER.

Fourth Embodiment

Hereinafter, the semiconductor device 100 according to the fourth embodiment and a method of manufacturing the same will be described with reference to FIGS. 30 to 34. In the following description, differences from the first embodiment will be mainly described, and description of points overlapping with the first embodiment will be omitted.

In the first embodiment, the n-type impurity region CSL is formed as the diffusion layer resistance for electron supply, but in the fourth embodiment, a strong inversion layer resistance having a similar function is formed by changing the configuration of the p-type base region PB.

Figure 30:
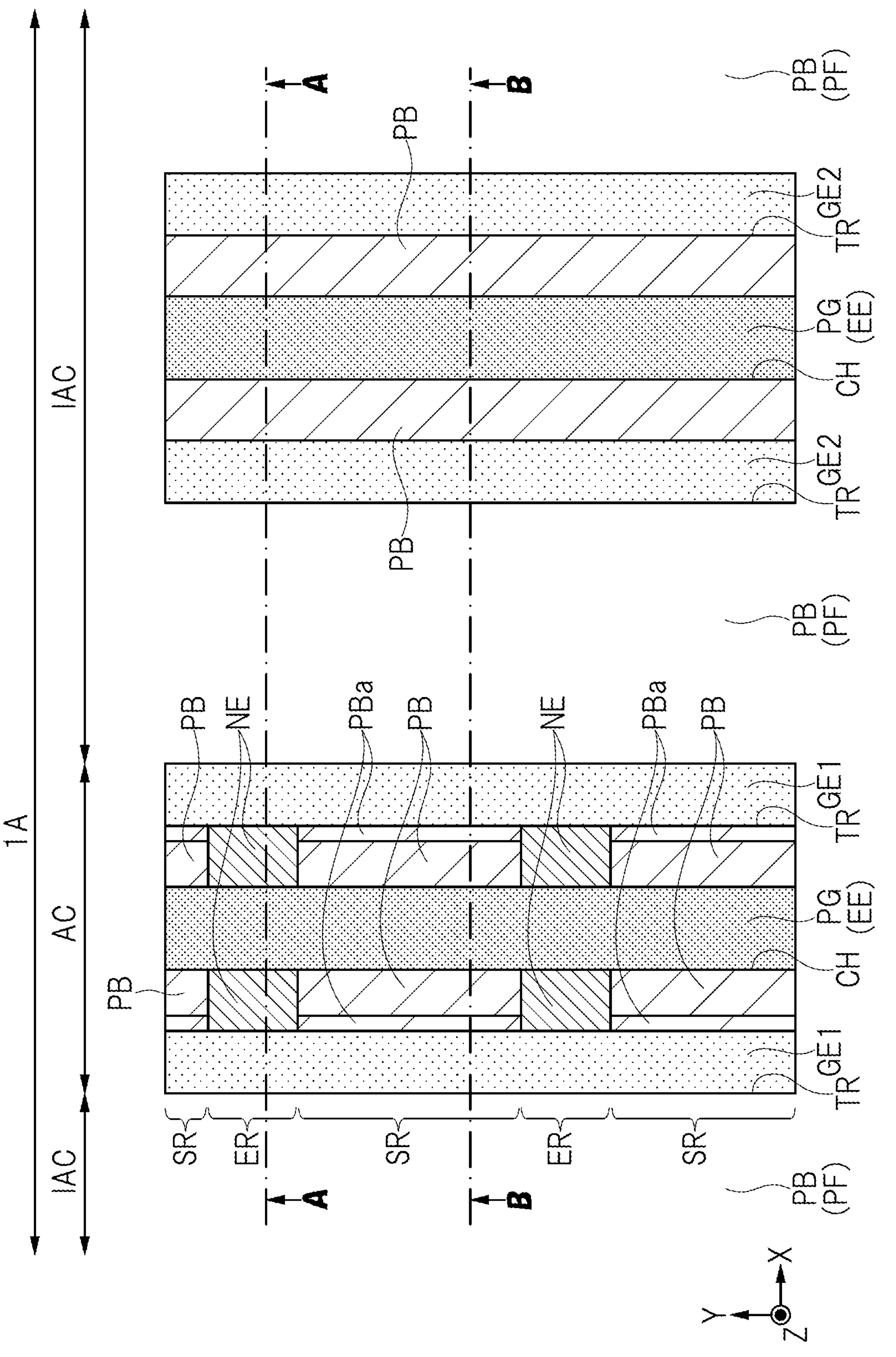
FIG. 30 is a plan view of a main part illustrating a semiconductor device according to a fourth embodiment.
Figure 31:
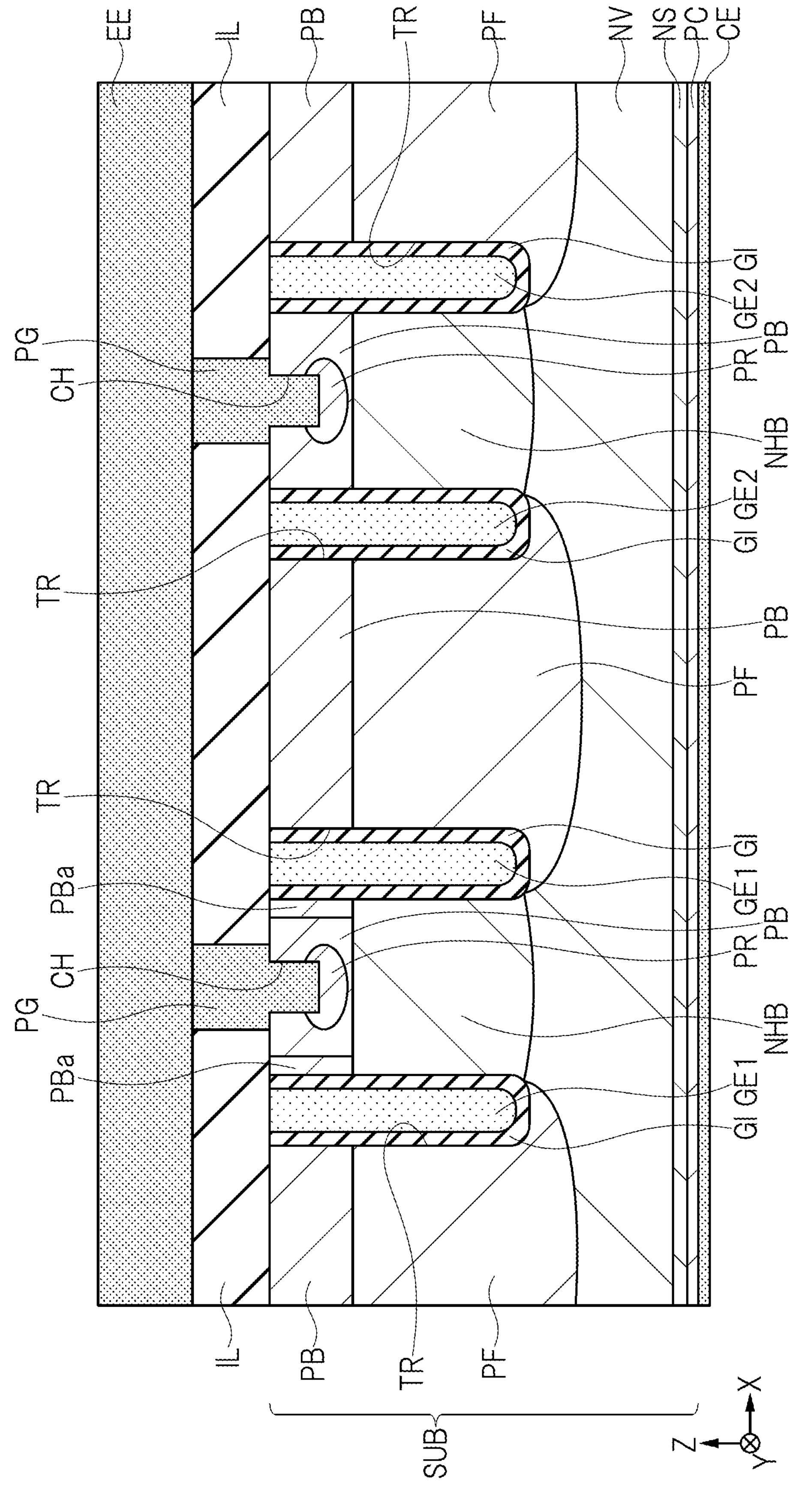
FIG. 31 is a cross-sectional view illustrating a semiconductor device according to the fourth embodiment.

As illustrated in FIGS. 30 and 31, also according to the fourth embodiment, the p-type base region PB is formed in the semiconductor substrate SUB of each of the emitter formation regions ER and the separation region SR. However, the impurity concentration of the base region PB at a position in contact with the trench TR in the separation region SR is lower than the impurity concentration of the base region PB of each emitter formation region ER. The base region PB at such a position is illustrated as a low-concentration region PBa. The impurity concentration of the low-concentration region PBa is, for example, $1\times10^{12}/cm^3$ or more and $1\times10^{14}/cm^3$ or less.

In the fourth embodiment, the high-concentration n-type impurity region NE described in the first modification is applied as the emitter region of the IGBT. In the separation region SR, the low-concentration region PBa is physically separated from the hole CH.

Since the base region PB is configured as described above, the threshold voltage in the separation region SR is lower than the threshold voltage in the emitter formation region ER. When the channel is formed in the base region PB of the emitter formation region ER at the time of turn-on, a strong inversion layer is formed in the separation region SR by the low-concentration region PBa. Therefore, since the resistance value at the portion in contact with the trench TR is reduced, electrons are easily supplied to the vicinity of the center of the separation region SR, and the switching loss is reduced.

As illustrated in the graph of FIG. 5, it can be seen that the switching loss is reduced in the fourth embodiment as compared with the study example. For example, as compared with the case where the forward saturation current Ic (sat) is 300 A, in the fourth embodiment, the switching loss is reduced by about 37% as compared with the study example. As described above, also according to the fourth embodiment, the switching loss can be reduced, and the performance of the semiconductor device 100 can be improved.

A manufacturing process for forming the base region PB and the low-concentration region PBa in the fourth embodiment will be described with reference to FIGS. 32 to 34. The manufacturing process of FIGS. 32 to 34 is performed instead of the manufacturing process of FIG. 11.

Figure 32:
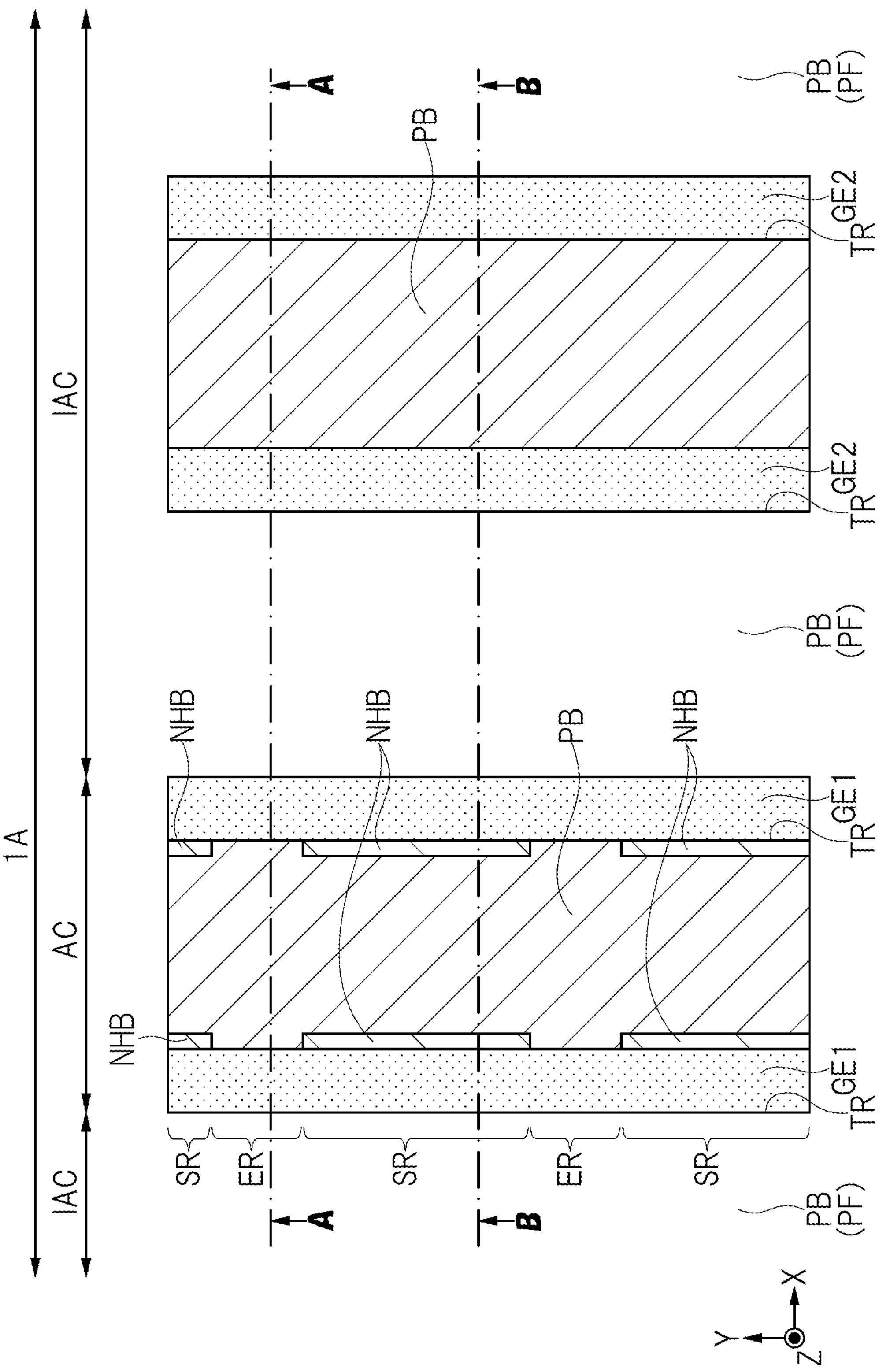
FIG. 32 is a plan view of a main part illustrating the manufacturing process of the semiconductor device according to the fourth embodiment.
Figure 33:
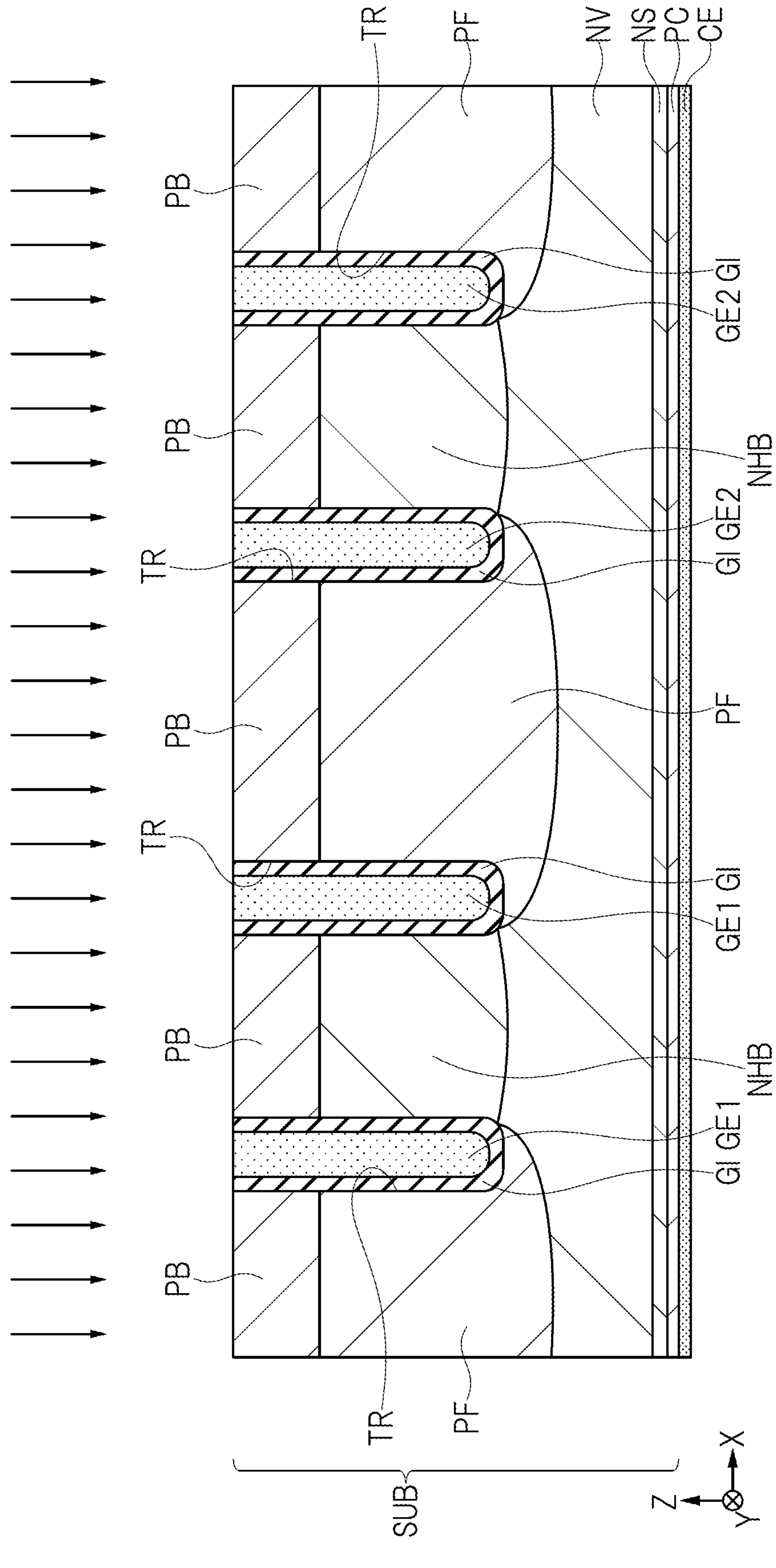
FIG. 33 is a cross-sectional view illustrating the manufacturing process of the semiconductor device according to the fourth embodiment.
Figure 34:
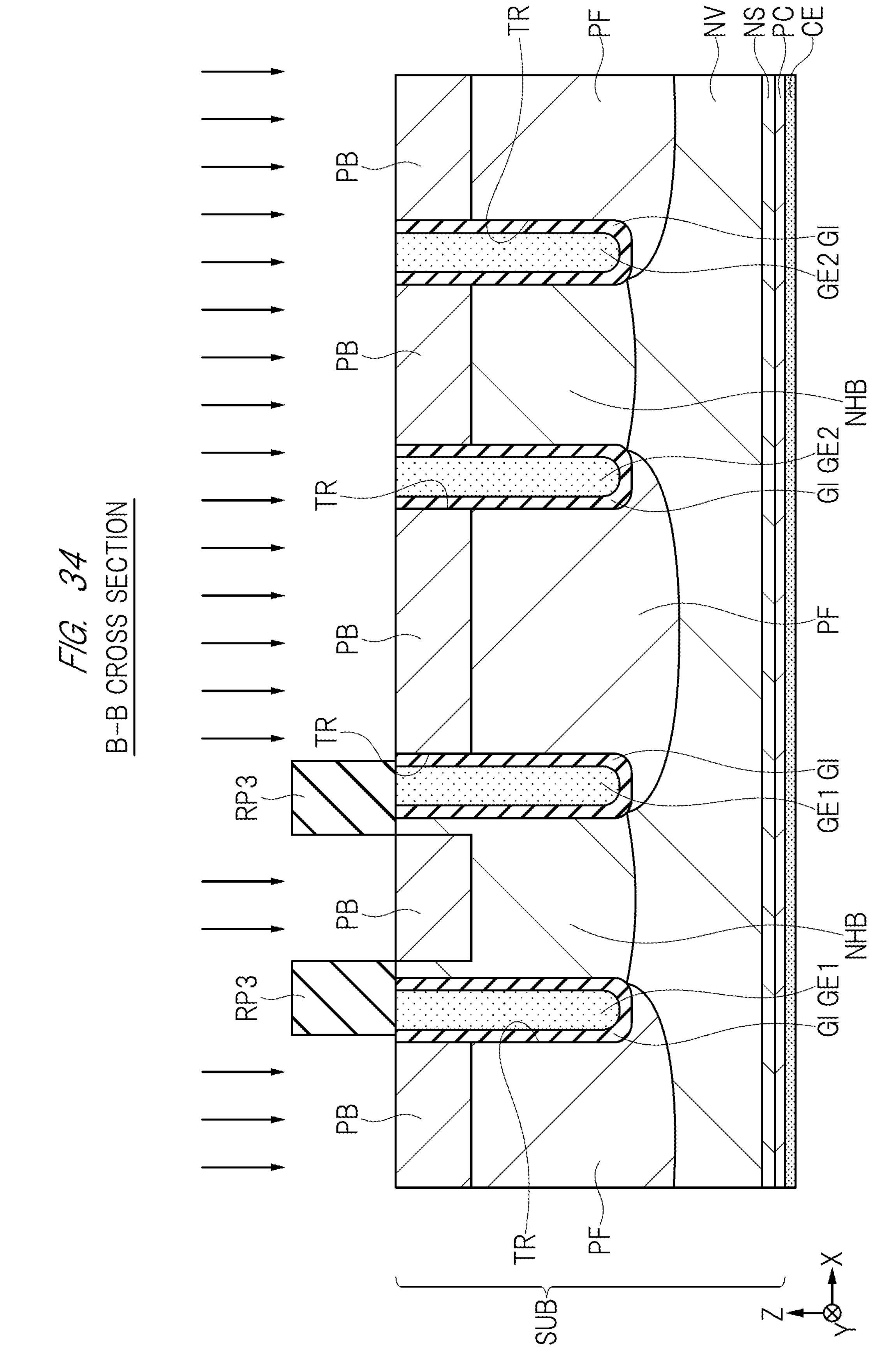
FIG. 34 is a cross-sectional view illustrating the manufacturing process of the semiconductor device according to the fourth embodiment.

As illustrated in FIGS. 32 to 34, according to the fourth embodiment, first, the resist pattern RP3 is formed on the upper surface of the semiconductor substrate SUB so as to cover a portion of the separation region SR that is in contact with the trench TR. Next, using the resist pattern RP3 as a mask, the p-type impurity is ion-implanted into the semiconductor substrate SUB of each emitter formation region ER and the semiconductor substrate SUB of the separation region SR excluding the above portions. The p-type impurity is, for example, boron (B). Thus, the base region PB is formed. Thereafter, the resist pattern RP3 is removed by ashing processing.

In this state, in the separation region SR, the n-type hole barrier region NHB exists between the base region PB and the trench TR. Thereafter, when heat treatment for activating impurities is performed, the p-type impurity in the separation region SR is diffused to a position in contact with the trench TR, and the low-concentration region PBa is formed.

Note that the position in contact with the trench TR by the heat treatment does not necessarily have to be of the p-type, and may be of the very thin n-type. For example, the portion in contact with the trench TR may be an impurity region having a concentration that does not establish ohmic contact with the plug PG, such as the impurity region CSL of the third embodiment.

Third Modification

Figure 35:
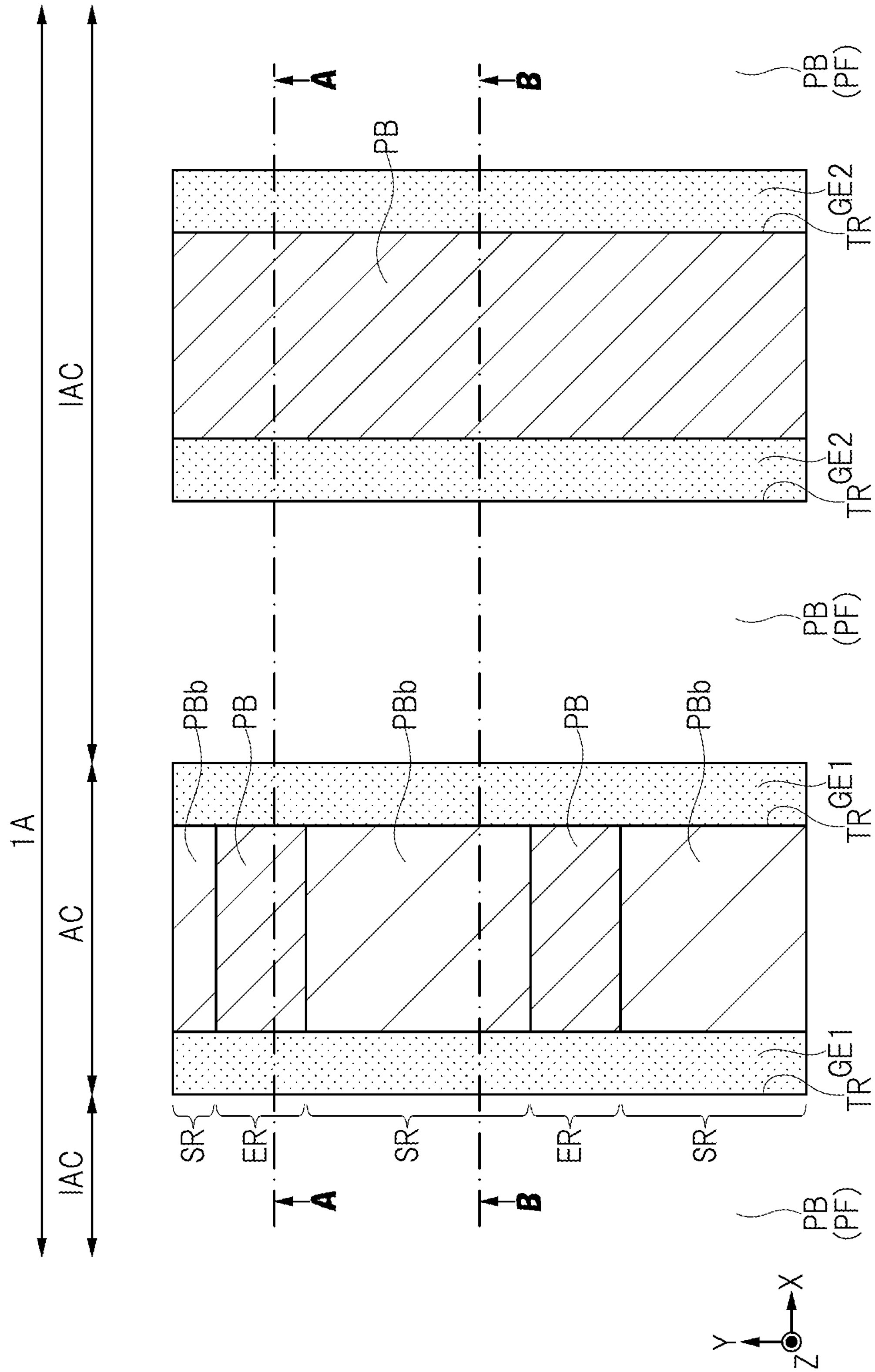
FIG. 35 is a plan view of a main part illustrating a semiconductor device according to a third modification.

FIG. 35 illustrates a configuration of a base region according to the third modification of the fourth embodiment. As illustrated in FIG. 35, according to the third modification, the base region PB of each emitter formation region ER is similar to that of the fourth embodiment, but the low-concentration region PBb having an impurity concentration lower than that of the base region PB is formed over the entire separation region SR. The impurity concentration of the low-concentration region PBb is, for example, $1\times10^{12}/cm^3$ or more and $1\times10^{14}/cm^3$ or less.

That is, the impurity concentration of not only the portion in contact with the trench TR but also the entire base region of the separation region SR is lower than the impurity concentration of the base region of each emitter formation region ER. Also in the third modification, the switching loss can be reduced to the same extent as the fourth embodiment.

A manufacturing process for forming the base region PB and the low-concentration region PBb according to the third modification will be described with reference to FIGS. 36 to 38. The manufacturing process of FIGS. 36 to 38 is performed instead of the manufacturing process of FIG. 11.

Figure 36:
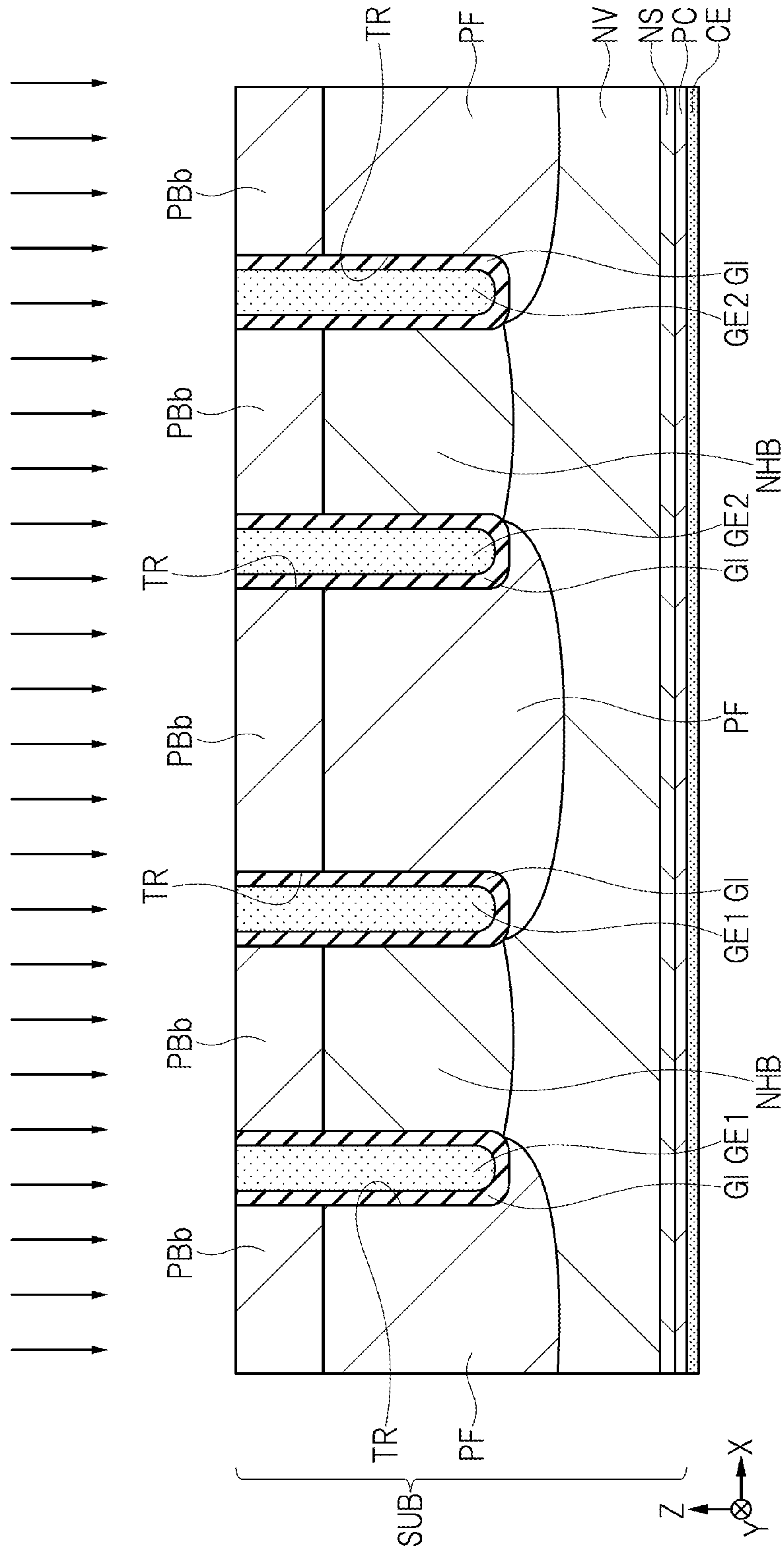
FIG. 36 is a cross-sectional view illustrating the manufacturing process of the semiconductor device according to the third modification.

As illustrated in FIG. 36, according to the third modification, first, the p-type impurity is ion-implanted into the semiconductor substrate SUB of the active cell AC and the inactive cell IAC to form the low-concentration region PBb. The p-type impurity is, for example, boron (B).

Figure 37:
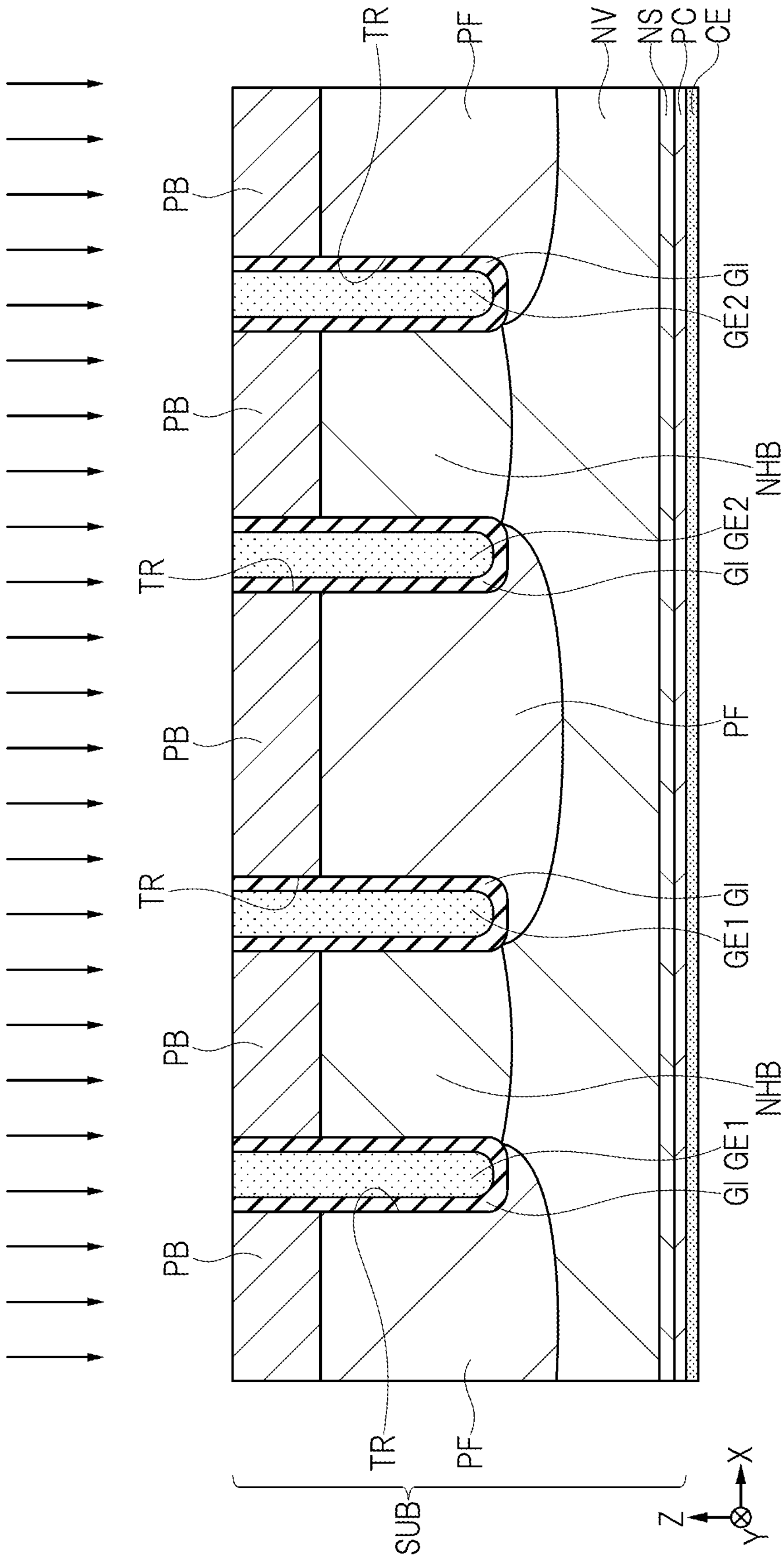
FIG. 37 is a cross-sectional view illustrating a manufacturing process subsequent to FIG. 36.
Figure 38:
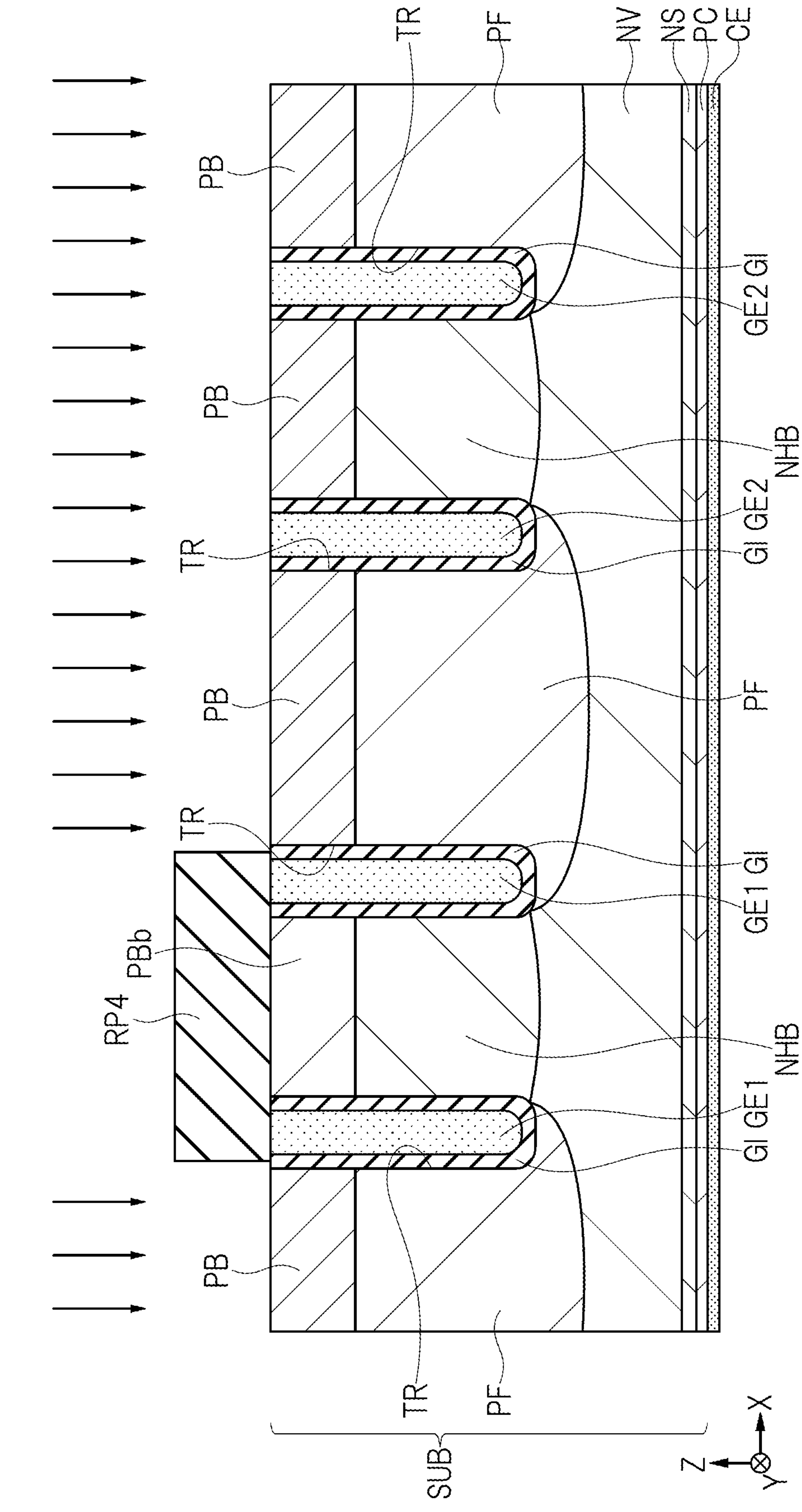
FIG. 38 is a cross-sectional view illustrating a manufacturing process subsequent to FIG. 36.

As illustrated in FIGS. 37 and 38, first, a resist pattern RP4 is formed on the upper surface of the semiconductor substrate SUB so as to cover the separation region SR. Next, using the resist pattern RP4 as a mask, the p-type impurity is ion-implanted into the semiconductor substrate SUB in each of the emitter formation regions ER. The p-type impurity is, for example, boron (B). Thus, the base region PB is formed. Thereafter, the resist pattern RP4 is removed by ashing processing. Note that the base region PB is also formed in the semiconductor substrate SUB of the inactive cell IAC.

The base region (low-concentration region PBb) of the separation region SR contains impurities ion-implanted in the manufacturing process of FIG. 38. The base region PB of each emitter formation region ER includes impurities ion-implanted in the manufacturing process of FIG. 38 and impurities ion-implanted in the manufacturing process of FIG. 39. Finally, the amount of impurity due to ion implantation in FIG. 39 is adjusted such that the impurity concentration of the base region PB of each emitter formation region ER becomes substantially the same as the impurity concentration of the base region PB of the first embodiment.

In the fourth embodiment, the low-concentration region PBb is formed using the resist pattern RP3. Here, when misalignment of the formation position of the resist pattern RP3 occurs, the width of the hole barrier NHB covered with the resist pattern RP3 varies in the separation region SR. Then, there is a problem that the width of the low-concentration region PBb in the X direction fluctuates and the resistance value as the strong inversion layer resistance fluctuates.

In the third modification, the resist pattern RP4 is used, but the end of the resist pattern RP4 only needs to be positioned on the gate insulating film GI or the gate electrode GE1 in the X direction, and can be arranged with a relatively large margin. Therefore, the misalignment in the X direction can be handled within the margin.

In the Y direction, if one end of the resist pattern RP4 is shifted, the other end of the resist pattern RP4 is also shifted in the same direction. That is, even if misalignment occurs in the formation position of the resist pattern RP4 in the Y direction, the width of the low-concentration region PBb of the separation region SR does not change. Therefore, according to the third modification, it is possible to suppress the fluctuation in the width of the low-concentration region PBb in the X direction and the Y direction.

Although the present invention has been specifically described above with reference to the embodiments, the present invention is not limited to these embodiments, and various modifications can be made without departing from the gist of the present invention.

For example, although the case where the IGBT has the GGEE structure has been exemplified in the above embodiment, the IGBT may have a GGEEs structure in which the GGEE structure is shrunk. In the GGEE structure, the width between the pair of gate electrodes GE1 and the width between the pair of gate electrodes GE2 are substantially the same. In the GGEEs structure, the width between the pair of gate electrodes GE2 is smaller than the width between the pair of gate electrodes GE1.

Hereinafter, some of the matters described in the above embodiment will be described.

[Supplementary Note 1]

A method of manufacturing a semiconductor device including:

(a) preparing a semiconductor substrate of a first conductivity type having an upper surface and a lower surface;

(b) forming a pair of first trenches in the semiconductor substrate on an upper surface side of the semiconductor substrate so as to extend in a first direction in plan view;

(c) forming a pair of first gate insulating films inside the pair of first trenches;

(d) embedding a pair of first gate electrodes inside the pair of first trenches via the pair of first gate insulating films;

(e) forming a base region of a second conductivity type opposite to the first conductivity type in the semiconductor substrate on an upper surface side of the semiconductor substrate; and (f) forming a first impurity region of the first conductivity type in the semiconductor substrate on an upper surface side of the semiconductor substrate, wherein the semiconductor substrate has, between the pair of first trenches, a first emitter formation region and a second emitter formation region that are separated from each other in the first direction, and a separation region located between the first emitter formation region and the second emitter formation region, wherein the base region is formed in the semiconductor substrate of each of the first emitter formation region, the second emitter formation region, and the separation region, wherein the first impurity region is formed in the base region of each of the first emitter formation region and the second emitter formation region, and wherein an impurity concentration of the base region at a first location in contact with the pair of first trenches in the separation region is lower than an impurity concentration of the base region of each of the first emitter formation region and the second emitter formation region.

[Supplementary Note 2]

The method of manufacturing a semiconductor device according to Supplementary Note 1, further including:

(g) forming an interlayer insulating film on an upper surface of the semiconductor substrate so as to cover the pair of first trenches;

(h) forming a hole in the interlayer insulating film and the semiconductor substrate so as to penetrate the first impurity region and reach the inside of the base region; and (i) forming an emitter electrode on the interlayer insulating film, wherein the base region and the first impurity region are electrically connected to the emitter electrode through the hole, and wherein the base region at the first location is physically separated from the hole.

[Supplementary Note 3]

The method of manufacturing a semiconductor device according to Supplementary Note 2, wherein an impurity concentration of the base region of each of the first emitter formation region and the second emitter formation region is $1\times10^{17}/cm^3$ or more and $1\times10^{18}/cm^3$ or less, and wherein an impurity concentration of the base region at the first location is $1\times10^{12}/cm^3$ or more and $1\times10^{14}/cm^3$ or less.

[Supplementary Note 4]

In the method of manufacturing a semiconductor device according to Supplementary Note 1, the step (e) includes:

(e1) ion-implanting impurity of the second conductivity type into the semiconductor substrate of each of the first emitter formation region and the second emitter formation region and into the semiconductor substrate of the separation region excluding the first location; and (e2) performing a heat treatment on the semiconductor substrate, wherein a part of impurities in the separation region ion-implanted in the step (f1) is diffused to the first location by the heat treatment.

[Supplementary Note 5]

In the method of manufacturing a semiconductor device according to Supplementary Note 1, the step (e) includes:

(e3) ion-implanting the impurity of the second conductivity type into the semiconductor substrate of each of the first emitter formation region, the second emitter formation region, and the separation region; and (e4) ion-implanting the impurity of the second conductivity type into the semiconductor substrate of each of the first emitter formation region and the second emitter formation region, wherein the base region of the separation region contains impurities ion-implanted in the step (e3), wherein the base region of each of the first emitter formation region and the second emitter formation region contains an impurity ion-implanted in the step (e3) and an impurity ion-implanted in the step (e4), and wherein an impurity concentration of the entire base region in the separation region is lower than an impurity concentration of the base region of each of the first emitter formation region and the second emitter formation region.

What is claimed is:

1. A semiconductor device comprising:

a semiconductor substrate of a first conductivity type having an upper surface and a lower surface;

a pair of first trenches formed in the semiconductor substrate on an upper surface side of the semiconductor substrate and extending in a first direction in plan view;

a pair of first gate insulating films formed inside the pair of first trenches;

a pair of first gate electrodes embedded in the pair of first trenches via the pair of first gate insulating films;

a base region of a second conductivity type opposite to the first conductivity type, the base region being formed in the semiconductor substrate on an upper surface side of the semiconductor substrate; and a first impurity region of the first conductivity type and a second impurity region of the first conductivity type formed in the semiconductor substrate on an upper surface side of the semiconductor substrate, wherein the semiconductor substrate has, between the pair of first trenches, a first emitter formation region and a second emitter formation region that are separated from each other in the first direction, and a separation region located between the first emitter formation region and the second emitter formation region, wherein the base region is formed in the semiconductor substrate of each of the first emitter formation region, the second emitter formation region, and the separation region, wherein the first impurity region is formed in the base region of each of the first emitter formation region and the second emitter formation region, wherein the second impurity region is formed in the base region at a first location in the separation region, the first location being in contact with the pair of first trenches, wherein the second impurity region is connected to the first impurity region of each of the first emitter formation region and the second emitter formation region, wherein the semiconductor device further comprises:

an interlayer insulating film formed on an upper surface of the semiconductor substrate so as to cover the pair of first trenches;

a hole formed in the interlayer insulating film and the semiconductor substrate so as to penetrate the first impurity region and reach the inside of the base region; and an emitter electrode formed on the interlayer insulating film, wherein the base region, the first impurity region, and the second impurity region are electrically connected to the emitter electrode through the hole, and wherein the second impurity region is physically separated from the hole in the separation region.

2. The semiconductor device according to claim 1, wherein the first impurity region and the second impurity region have the same impurity concentration.

3. The semiconductor device according to claim 1, wherein the first impurity region has an impurity concentration higher than an impurity concentration of the second impurity region.

4. The semiconductor device according to claim 1,
wherein a third impurity region of the first conductivity type is formed in the base region at a second location in the separation region, the second location being in contact with the hole,
wherein the third impurity region is connected to the first impurity region of each of the first emitter formation region and the second emitter formation region, and
wherein the second impurity region and the third impurity region are separated from each other in the separation region.

5. A semiconductor device comprising:
a semiconductor substrate of a first conductivity type having an upper surface and a lower surface;
a pair of first trenches formed in the semiconductor substrate on an upper surface side of the semiconductor substrate and extending in a first direction in plan view;
a pair of first gate insulating films formed inside the pair of first trenches;
a pair of first gate electrodes embedded in the pair of first trenches via the pair of first gate insulating films;
a base region of a second conductivity type opposite to the first conductivity type, the base region being formed in the semiconductor substrate on an upper surface side of the semiconductor substrate; and
a first impurity region of the first conductivity type and a second impurity region of the first conductivity type formed in the semiconductor substrate on an upper surface side of the semiconductor substrate,
wherein the semiconductor substrate has, between the pair of first trenches, a first emitter formation region and a second emitter formation region that are separated from each other in the first direction, and a separation region located between the first emitter formation region and the second emitter formation region,
wherein the base region is formed in the semiconductor substrate of each of the first emitter formation region, the second emitter formation region, and the separation region,
wherein the first impurity region is formed in the base region of each of the first emitter formation region and the second emitter formation region,
wherein an impurity concentration of the base region at a first location in contact with the pair of first trenches in the separation region is lower than an impurity concentration of the base region of each of the first emitter formation region and the second emitter formation region,
wherein the semiconductor device further comprises:
an interlayer insulating film formed on an upper surface of the semiconductor substrate so as to cover the pair of first trenches;
a hole formed in the interlayer insulating film and the semiconductor substrate so as to penetrate the first impurity region and reach the inside of the base region; and
an emitter electrode formed on the interlayer insulating film,
wherein the base region and the first impurity region are electrically connected to the emitter electrode through the hole, and
wherein the base region at the first location is physically separated from the hole.

6. The semiconductor device according to claim 5,
wherein an impurity concentration of the base region of each of the first emitter formation region and the second emitter formation region is $1\times10^{17}/cm^3$ or more and $1\times10^{18}/cm^3$ or less, and
wherein an impurity concentration of the base region at the first location is $1\times10^{12}/cm^3$ or more and $1\times10^{14}/cm^3$ or less.

* * * * *